United States Patent
Sato et al.

(10) Patent No.: US 7,589,528 B2
(45) Date of Patent: *Sep. 15, 2009

(54) MAGNETIC SENSOR FORMED OF MAGNETORESISTANCE EFFECT ELEMENTS

(75) Inventors: Hideki Sato, Iwata-gun (JP); Toshiyuki Oohashi, Hamamatsu (JP); Yukio Wakui, Iwata-gun (JP); Susumu Yoshida, Hamamatsu (JP); Kokichi Aiso, Hamamatsu (JP)

(73) Assignee: Yamaha Corporation, Shizuoka-Ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/682,841

(22) Filed: Mar. 6, 2007

(65) Prior Publication Data

US 2007/0182407 A1   Aug. 9, 2007

Related U.S. Application Data

(60) Continuation of application No. 10/821,913, filed on Apr. 12, 2004, which is a division of application No. 10/052,525, filed on Jan. 23, 2002, now Pat. No. 6,904,669.

(30) Foreign Application Priority Data

Jan. 24, 2001 (JP) .............................. 2001-15805
Sep. 17, 2001 (JP) .............................. 2001-281703

(51) Int. Cl.
*G01R 33/02* (2006.01)

(52) U.S. Cl. ...................... 324/252; 324/247

(58) Field of Classification Search ............ 324/207.21, 324/252, 247, 249; 338/32 R
See application file for complete search history.

(56) References Cited

U.S. PATENT DOCUMENTS 5,315,282 A    5/1994 Shinjo et al.

(Continued)

FOREIGN PATENT DOCUMENTS

CN    1229196 A    9/1999

(Continued)

OTHER PUBLICATIONS

Precision X-Y Robotic Object Handling Using a Dual GMR Bridge Sensor, Ku et al., IEEE Transactions on Magnetics, vol. 36, No. 5, Sep. 2000, pp. 2782-2784.*

(Continued)

*Primary Examiner*—Patrick J Assouad
*Assistant Examiner*—David M. Schindler
(74) *Attorney, Agent, or Firm*—Dickstein Shapiro LLP

(57) ABSTRACT

On a single chip are formed a plurality of magnetoresistance effect elements provided with pinned layers having fixed magnetization axes in the directions that cross each other. On a substrate 10 are formed magnetic layers that will become two magnetic tunnel effect elements 11, 21 as magnetoresistance effect elements. Magnetic-field-applying magnetic layers made of NiCo are formed to sandwich the magnetic layers in plan view. A magnetic field is applied to the magnetic-field-applying magnetic layers. The magnetic field is removed after the magnetic-field-applying magnetic layers are magnetized in the direction shown by arrow A. As a result of this, by the residual magnetization of the magnetic-field-applying magnetic layers, magnetic fields in the directions shown by arrows B are applied to the magnetic layers that will become magnetic tunnel effect elements 11, 21, whereby the magnetization of the pinned layers of the magnetic layers that will become magnetic tunnel effect elements 11, 21 is pinned in the directions shown by arrows B.

3 Claims, 26 Drawing Sheets

U.S. PATENT DOCUMENTS

| | | | |
|---|---|---|---|
| 5,561,368 A | | 10/1996 | Dovek et al. |
| 5,945,825 A | | 8/1999 | Clemens |
| 6,465,053 B1 | | 10/2002 | Lenssen et al. |
| 7,187,167 B2 | * | 3/2007 | Sato et al. .................. 324/244 |
| 2002/0006017 A1 | | 1/2002 | Adelerhof |
| 2004/0179295 A1 | * | 9/2004 | Sato et al. .................. 324/252 |

FOREIGN PATENT DOCUMENTS

| | | | |
|---|---|---|---|
| DE | 196 49 265 A1 | | 6/1998 |
| DE | 197 42 366 C1 | | 5/1999 |
| DE | 199 33 209 A1 | | 2/2000 |
| DE | 198 30 343 C1 | | 4/2000 |
| EP | 0 905 523 A3 | | 3/1999 |
| JP | 4-218982 | | 8/1992 |
| JP | 10-70325 | | 3/1998 |
| JP | 10-170619 | | 6/1998 |
| JP | 11-194161 | | 7/1999 |
| JP | 2000-35470 | | 2/2000 |
| JP | 2000-49029 | | 2/2000 |
| JP | 2000-338211 | | 12/2000 |
| JP | 2001-345498 | | 12/2001 |
| WO | WO-9638739 | | 12/1996 |
| WO | WO 0079298 A2 | * | 12/2000 |

OTHER PUBLICATIONS

Notification of Reasons for Refusal dated Aug. 12, 2003 (and English translation of same).
"Magnetic Sensor Giant Magneto Resistors", Application Notes 10.98, Oct. 1998, Siemens Aktiengesellschaft, Germany.
Partial European Search Report dated Feb. 4, 2004.
Ku et al., "Precision X-Y Robotic Object Handling Using Dual GMR Bridge Sensor", , IEEE Transactions on Magnetics, vol. 36, No. 5, pp. 2782-2784 (Sep. 2000).
Black & Fayfield, "High-Speed Circuits Employing On-Chip Magnetic Components", Mixed-Signal Design, SSMSD 99, 1999 Southwest Symposium, pp. 156-191 (1999).
European Search Report dated Jun. 8, 2004.
Hill et al., Sensors and Actuators A, vol. 59, pp. 30-37 (1997).
Ron Neale, "Taming the Giant MagnetoResistance (GMR) effect", Sensors, Electronic Engineering, pp. 36-40 (1996).
Smith et al., "The Growing Role of Solid-State Magnetic Sensing", Sensors Expo-Detroit, pp. 139-149 (1997).
Spong et al., "Giant Magnetoresistive Spin Valve Bridge Sensor", IEEE Transactions on Magnetics, vol. 32, No. 2, pp. 366-371 (1996).
Daughton et al., "Magnetic Field Sensors Using GMR Multilayer", IEEE Transactions on Magnetics, vol. 30, No. 6, pp. 4608-4610 (1994).

* cited by examiner

MAGNETIC SENSOR FORMED OF MAGNETORESISTANCE EFFECT ELEMENTS

CROSS REFERENCE TO RELATED APPLICATIONS

This application is a Continuation of U.S. patent application Ser. No. 10/821,913, filed Apr. 12, 2004 which in turn is a Division of U.S. patent application Ser. No. 10/052,525 filed on Jan. 23, 2002, claiming priority of Japanese Application No. 2001-281703, dated Sep. 17, 2001, and Japanese Application No. 2001-15805, dated Jan. 24, 2001, the contents of each are hereby incorporated by reference herein.

BACKGROUND OF THE INVENTION

1. Field of the Invention

The present invention relates to a magnetic sensor using a magnetoresistance effect (magnetoresistive effect) element containing a pinned layer and a free layer, and more particularly to a magnetic sensor having two or more magnetoresistance effect elements formed on a single chip where the magnetization directions of the pinned layers of the magnetoresistance effect elements cross each other, as well as a method of producing the same 2. Description of the Background Art Hitherto, as an element usable in a magnetic sensor, there are known a giant magnetoresistance element (GMR element), a magnetic tunnel effect element (TMR element, tunneling GMR), and others. These magnetoresistance effect elements are provided with a pinned layer whose magnetization direction is pinned (fixed) in a predetermined direction and a free layer whose magnetization direction changes in accordance with an external magnetic field, thereby exhibiting a resistance value that accords with the relative relationship between the magnetization direction of the pinned layer and the magnetization direction of the free layer.

However, it is difficult to form two or more magnetoresistance effect elements on a single minute chip where the magnetization directions of the pinned layers of the magnetoresistance effect elements cross each other. Such a single chip has not been proposed yet, and therefore there arises a problem such that a magnetic sensor made of a single chip using a magnetoresistance effect element cannot have a wider application range due to the restriction imposed on the magnetization direction of the pinned layer.

SUMMARY OF THE INVENTION

A characteristic feature of the present invention lies in a magnetic sensor including a magnetoresistance effect element that contains a pinned layer and a free layer, said magnetoresistance effect element having a resistance value that changes in accordance with a relative angle formed by (or between)the magnetization direction of the pinned layer and the magnetization direction of the free layer, said magnetic sensor being formed in such a manner that a plurality of said magnetoresistance effect elements are provided on a single chip (one and the same substrate), and the pinned layers of at least two of said plurality of magnetoresistance effect elements have magnetization directions that cross each other.

This allows that, since magnetoresistance effect elements in which the magnetization directions of the pinned layers cross each other are formed on one and the same substrate, a magnetic sensor having a small size and a wide application range is provided.

Another characteristic feature of the present invention lies in a method of producing a magnetic sensor including a magnetoresistance effect element that contains a pinned layer and a free layer, said magnetoresistance effect element having a resistance value that changes in accordance with a relative angle formed by the magnetization direction of the pinned layer and the magnetization direction of the free layer, said method including the steps of: forming a layer containing a magnetic layer that will become said pinned layer (for example, an antiferromagnetic layer and a ferromagnetic layer) in a predetermined configuration on a substrate; forming magnetic-field-applying magnetic layers for applying a magnetic field to the layer containing the magnetic layer that will become said pinned layer: magnetizing said magnetic-field-applying magnetic layers; and pinning the magnetization direction of the magnetic layer that will become said pinned layer with the residual magnetization of said magnetic-field-applying magnetic layers.

According to the method above, the magnetic-field-applying magnetic layers for applying a magnetic field to the layer containing the magnetic layer that will become the pinned layer are formed, for example, by plating or the like, and thereafter these magnetic-field-applying magnetic layers are magnetized. The magnetic field produced by the residual magnetization of the aforesaid magnetic-field-applying magnetic layers then pins the magnetization direction of the magnetic layer that will become the aforesaid pinned layer. In this case, the step of forming said magnetic-field-applying magnetic layers is advantageously a step of forming said magnetic-field-applying magnetic layers so as to sandwich the layer containing the magnetic layer that will become said pinned layer in a plan view, and the magnetization direction of said magnetic-field-applying magnetic layers is advantageously different from a direction of the magnetic field produced by said residual magnetization.

The direction of the magnetic field produced by the residual magnetization of the aforesaid magnetic-field-applying magnetic layers is dependent on the shape of the end surface of the magnetic-field-applying magnetic layers. Therefore, by making a suitably shaped end surface or by suitably placing the layer containing the magnetic layer that will become the pinned layer with respect to the end surface, the layer containing the magnetic layer that will become the pinned layer can be imparted with a magnetization having an arbitrary direction. This allows that two or more magnetoresistance effect elements having pinned layers with magnetizations pinned in different directions from each other can be easily produced on one and the same substrate.

Still another characteristic feature of the present invention lies in a method of producing a magnetic sensor including a magnetoresistance effect element that contains a pinned layer and a free layer, said magnetoresistance effect element having a resistance value that changes in accordance with a relative angle formed by a magnetization direction of the pinned layer and a magnetization direction of the free layer, said method including the steps of preparing a magnet array constructed in such a manner that a plurality of permanent magnets are arranged at lattice points of a square lattice, where a polarity of a magnetic pole of each permanent magnet is different from a polarity of other magnetic poles that are adjacent thereto and spaced apart therefrom by the shortest distance; disposing a wafer in which a layer containing a magnetic layer that will at least become said pinned layer has been formed, above said magnet array; and pinning the magnetization direction of the magnetic layer that will become said pinned layer by using a magnetic field formed between one of said magnetic poles and another of said magnetic poles that is adjacent thereto and spaced apart therefrom by the shortest distance.

The above-mentioned magnet array is constructed in such a manner that a plurality of permanent magnets are disposed at lattice points of a square lattice, where a polarity of a magnetic pole of each permanent magnet is different from a polarity of other magnetic poles that are adjacent thereto and spaced apart therefrom by the shortest distance. Therefore, above the magnet array, in a plan view of the magnet array, a magnetic field in the rightward direction from one N-pole to the S-pole located on the right side of the N-pole, a magnetic field in the upward direction from the N-pole to the S-pole located on the upside of the N-pole, a magnetic field in the leftward direction from the N-pole to the S-pole located on the left side of the N-pole, and a magnetic field in the downward direction from the N-pole to the S-pole located on the downside of the N-pole are formed (See FIGS. 56 and 57). Similarly, to one S-pole, a magnetic field in the leftward direction from the N-pole located on the right side of the S-pole, a magnetic field in the downward direction from the N-pole located on the upside of the S-pole, a magnetic field in the rightward direction from the N-pole located on the left side of the S-pole, and a magnetic field in the upward direction from the N-pole located on the downside of the S-pole are formed. The above-described method pins the magnetization direction of the layer that will become the pinned layer by using these magnetic fields, whereby a magnetic sensor in which the magnetization directions of the pinned layers cross each other (in this case, perpendicular to each other) can be easily produced on a single chip.

BRIEF DESCRIPTION OF THE DRAWINGS

These and other objects, features, aspects, and advantages of the present invention will become more apparent from the following detailed description of the present invention when taken in conjunction with the accompanying drawings, in which.

DESCRIPTION OF THE PREFERRED EMBODIMENTS

Hereafter, embodiments of the magnetic sensor according to the present invention will be described with reference to the attached drawings. The magnetic sensor according to the first embodiment includes a generally square-shaped substrate 10 made of, for example, $SiO_2/Si$, glass, or quartz, two magnetic tunnel effect elements (groups) 11, 21, a coil 30 for bias magnetic field, and a plurality of electrode pads 40a to 40f, as illustrated in the plan view of FIG. 1. Magnetic tunnel effect elements (groups) 11, 21 and coil 30 for bias magnetic field are connected respectively to electrode pads 40a, 40b, 40c, 40d, and 40e, 40f. Since magnetic tunnel effect element (group) 11 and magnetic tunnel effect element (group) 21 are identical in structure, magnetic tunnel effect element (group) 11 will be described hereafter as a representative example, and the description of magnetic tunnel effect element (group) 21 will be omitted.

Figure 2:
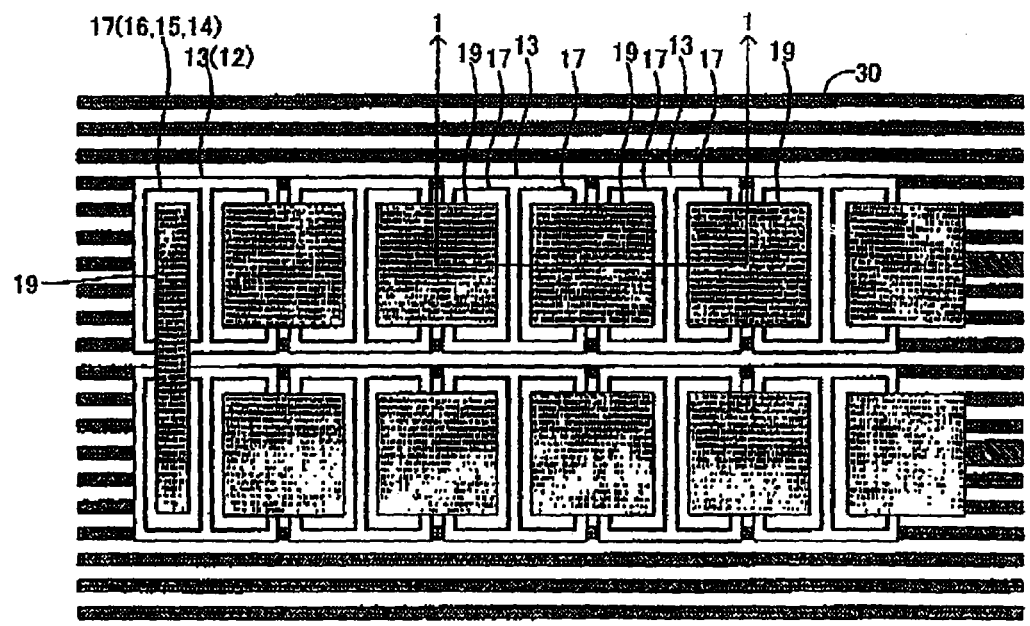
FIG. 2 is an enlarged view of the magnetic tunnel effect element (group) shown in FIG. 1.
Figure 3:
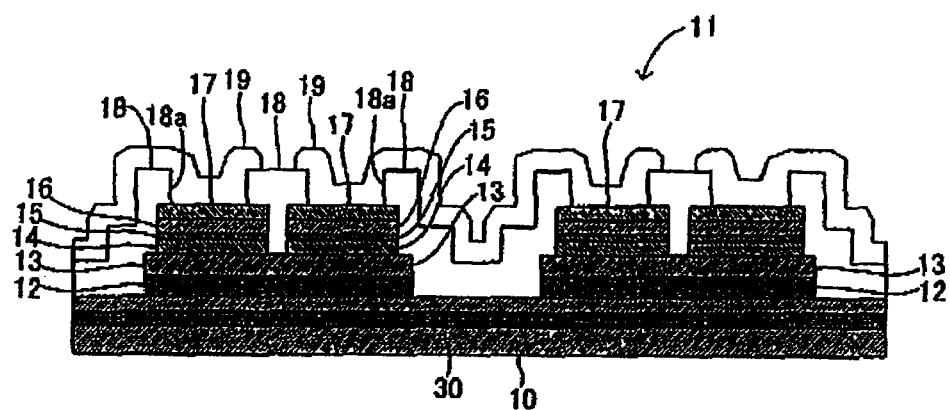
FIG. 3 is a cross-sectional view of the magnetic tunnel effect element (group) shown in FIG. 2 and cut with a plane along the line 1-1.

Magnetic tunnel effect element (group) 11 is made of a plurality of (in this example, twenty) magnetic tunnel effect elements that are connected in series, as illustrated in the enlarged plan view of FIG. 2. Each magnetic tunnel effect element includes a plurality of lower electrodes 12 having a rectangular shape in a plan view on substrate 10, as illustrated in FIG. 3 showing a partial cross-sectional view along the 1-1 plane of FIG. 2. Lower electrodes 12 are arranged in a row and spaced apart from each other by a predetermined distance in the lateral direction. Lower electrodes 12 are made of Ta (which may be Cr or Ti), which is an electrically conductive non-magnetic metal material, and are formed to have a thickness of about 30 nm. On each lower electrode 12 is respectively laminated an antiferromagnetic film 13 made of PtMn having a thickness of about 30 nm and formed to have the same planar shape as lower electrode 12.

Figure 4:
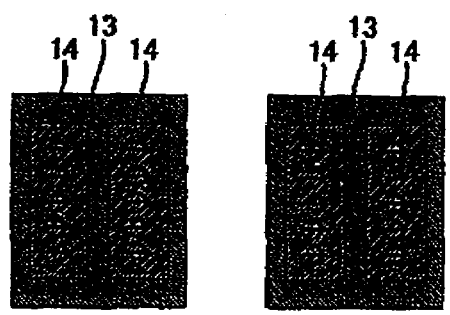
FIG. 4 is a schematic plan view of the magnetic tunnel effect element shown in FIG. 3, illustrating an antiferromagnetic film and a ferromagnetic film (pinned layer) of the element.

A pair of ferromagnetic films 14, 14 made of NiFe having a thickness of about 20 nm is laminated at an interval on each antiferromagnetic film 13. These ferromagnetic films 14, 14 have a rectangular shape in a plan view and are arranged so that the longer sides thereof oppose each other in parallel. The ferromagnetic films 14, 14 constitute a pinned layer in which the magnetization direction is pinned by the antiferromagnetic film 13. The ferromagnetic films 14, 14 are magnetized in the direction of arrows in the partially enlarged plan view of FIG. 4 (i.e. in the rightward direction). Here, the antiferromagnetic film 13 and the ferromagnetic films (pinned layers) 14, 14 constitute a fixed magnetization layer in which the magnetization direction of the ferromagnetic films 14, 14 is substantially fixed (i.e. having a fixed magnetization axis).

On each ferromagnetic film 14 is formed an insulating layer 15 having the same planar shape as the ferromagnetic film 14. This insulating layer 15 is made of $Al_2O_3$ (Al—O), which is an insulating material, and is formed to have a thickness of about 1 nm.

On the insulating layer 15 is formed a ferromagnetic film 16 having the same planar shape as the insulating layer 15 and made of NiFe with a thickness of about 80 nm. This ferromagnetic film 16 constitutes a free layer (free magnetization layer) whose magnetization direction changes in accordance with the direction of an external magnetic field, and constitutes a magnetic tunnel junction structure together with the pinned layer made of the aforesaid ferromagnetic film 14 and the aforesaid insulating layer 15. In other words, the antiferromagnetic film 13, the ferromagnetic film 14, the insulating layer 15, and the ferromagnetic film 16 constitute one magnetic tunnel effect element (excluding the electrodes and others).

On each ferromagnetic film 16 is respectively formed a dummy film 17 having the same planar shape as each ferromagnetic film 16. This dummy film 17 is constituted with an electrically conductive non-magnetic metal material made of a Ta film having a thickness of about 40 nm.

An interlayer insulating layer 18 for insulated separation of the plurality of lower electrodes 12 and the antiferromagnetic film 13 and for respective insulated separation of the pair of ferromagnetic films 14, the insulating layers 15, the ferromagnetic films 16, and the dummy films 17 disposed on each antiferromagnetic film 13 is formed in a region that covers the substrate 10, lower electrode 12, antiferromagnetic film 13, ferromagnetic films 14, insulating layers 15, ferromagnetic films 16, and dummy films 17. The interlayer insulating layer 18 is made of $SiO_2$ and has a thickness of about 250 nm.

Through this interlayer insulating layer 18, a contact hole 18a is respectively formed on each dummy film 17. Upper electrodes 19, 19 made of, for example, Al having a thickness of about 300 nm are respectively formed so as to fill in the contact hole 18a and to electrically connect each one of the pair of dummy films 17, 17 disposed on a different lower electrode 12 (and antiferromagnetic film 13). Thus, by electrically connecting each of the ferromagnetic films 16, 16 (each of the dummy films 17, 17) and each of the antiferromagnetic films 13, 13 of a pair of adjacent magnetic tunnel junction structures alternately and successively with the lower electrode 12, antiferromagnetic film 13, and upper electrode 19, there is formed a magnetic tunnel effect element (group) 11 in which a plurality of magnetic tunnel junction structures whose pinned layers have the same magnetization direction are connected in series. Here, a protective film made of SiO and SiN (illustration omitted) is formed on the upper electrodes 19, 19.

The coil 30 is for imparting a bias magnetic field of alternating current to the above-described magnetic tunnel effect elements (groups) 11, 21, and is buried in the upper part of substrate 10 so as to extend under the magnetic tunnel effect elements (groups) 11, 21 in a direction parallel to the magnetization direction of the pinned layer of the magnetic tunnel effect elements (groups) 11, 21.

Next, a method of producing the above-mentioned magnetic tunnel effect elements will be described with reference to FIGS. 5 to 17. Here, in FIGS. 5 to 12 and FIGS. 14 to 17, a magnetic tunnel effect element group made of four magnetic tunnel effect elements that are connected in series is shown for the sake of description. Further, in these Figures, illustration of coil 30 is omitted.

Figure 5:
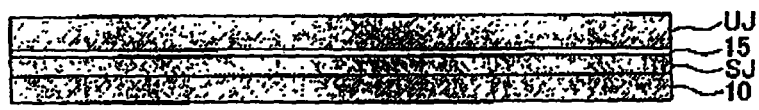
FIG. 5 is a schematic cross-sectional view of the magnetic sensor according to embodiment 1 at one stage during the production.

First, as illustrated in FIG. 5, a film made of Ta constituting the lower electrode 12 is formed to a thickness of about 30 nm by sputtering on a substrate 10 (which is, at this stage, one sheet of substrate from which a plurality of magnetic sensors will be obtained by a later dicing process). Then, a film made of PtMn and a film made of NiFe for constructing the antiferromagnetic film 13 and the ferromagnetic film (pinned layer) 14 of the fixed magnetization layer are formed to have a thickness of 30 nm and 20 nm, respectively, by sputtering. In this description, the lower electrode 12, the PtMn film which will be the antiferromagnetic film 13, and the FeNi film which will be the ferromagnetic film 14 are referred to as a lower magnetic layer SJ.

Figure 6:
FIG. 6 is a schematic cross-sectional view of the magnetic sensor according to embodiment 1 at one stage during the production.
Figure 7:
FIG. 7 is a schematic cross-sectional view of the magnetic sensor according to embodiment 1 at one stage during the production.

Thereafter, Al is laminated for only 1 am, and this is oxidized by oxygen gas to form an $Al_2O_3$ (Al—O) film which will become the insulating layer 15. Subsequently, a film made of NiFe constituting the ferromagnetic film 16 of the free layer is formed, for example, to have a thickness of 80 nm by sputtering, and a film made of Ta constituting the dummy film 17 is formed to have a thickness of 40 nm thereon. Here, the ferromagnetic film 16 and the dummy film 17 are referred to as an upper magnetic layer UJ. Next, by ion milling or the like, the upper magnetic layer UJ is processed for separation, as illustrated in FIG. 6, and the lower magnetic layer SJ is processed for separation, as illustrated in FIG. 7. As a result, the layer having a predetermined configuration, which will be the magnetic tunnel effect elements, is formed.

Figure 8:
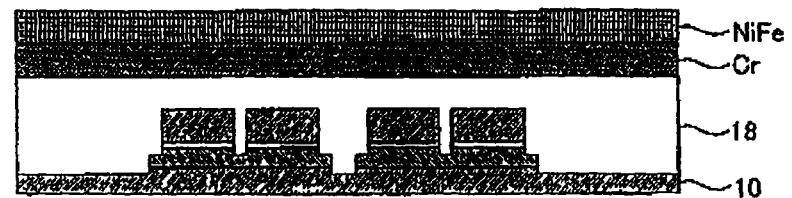
FIG. 8 is a schematic cross-sectional view of the magnetic sensor according to embodiment 1 at one stage during the production.
Figure 9:
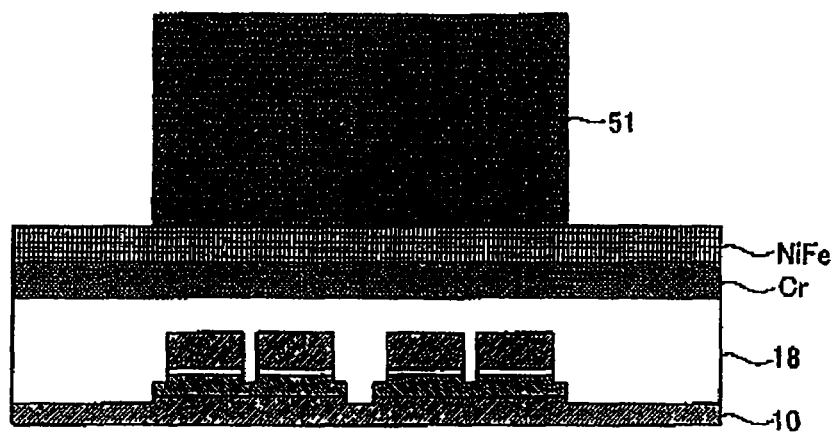
FIG. 9 is a schematic cross-sectional view of the magnetic sensor according to embodiment 1 at one stage during the production.

Next, as illustrated in FIG. 8, a film made of $SiO_2$ constituting the interlayer insulating layer 18 is formed by sputtering so that the thickness thereof on the elements will be 250 nm, and a film made of Cr and a film made of NiFe are formed thereon by sputtering to have a thickness of 100 nm and 50 nm, respectively, as a plating underlayer film. Next, a resist 51 is applied, as illustrated in FIG. 9. The resist 51 is patterned into a predetermined shape so as not to cover the part where the plating will be carried out later.

Figure 10:
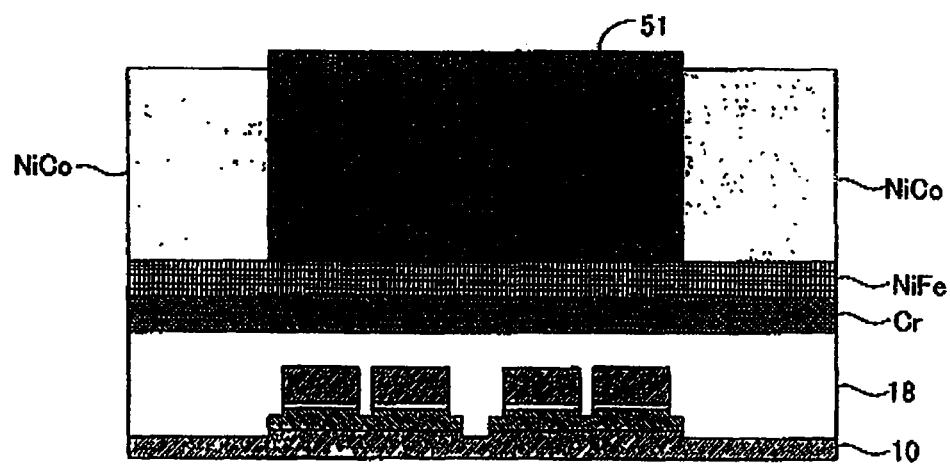
FIG. 10 is a schematic cross-sectional view of the magnetic sensor according to embodiment 1 at one stage during the production.
Figure 11:
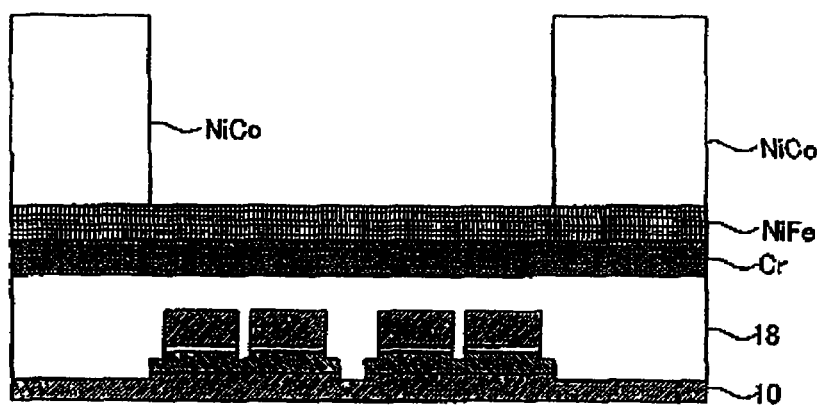
FIG. 11 is a schematic cross-sectional view of the magnetic sensor according to embodiment 1 at one stage during the production.
Figure 12:
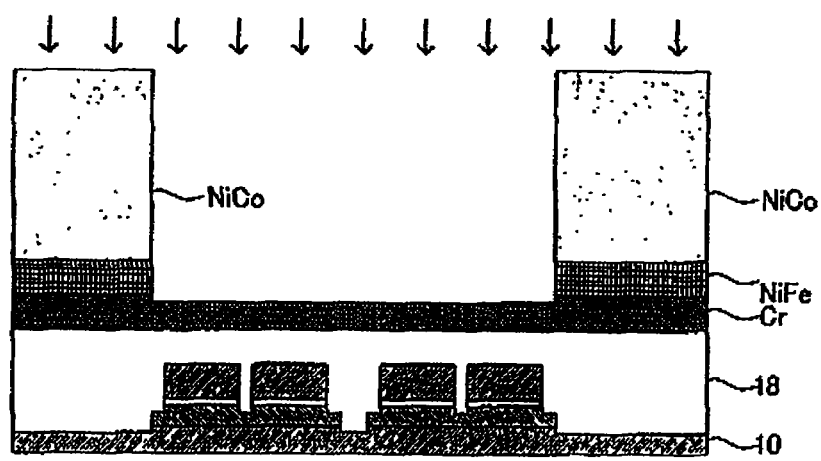
FIG. 12 is a schematic cross-sectional view of the magnetic sensor according to embodiment 1 at one stage during the production.

Next, as illustrated in FIG. 10, the wafer is plated with NiCo as a magnetic-field-applying magnetic layer. The thickness of NiCo is, for example, set to be 10 .mu.m. Then, after the resist is removed as illustrated in FIG. 11, the entire surface is subjected to milling (Ar milling) to remove WiFe formed as the plating underlayer film, as illustrated in FIG. 12.

Figure 13:
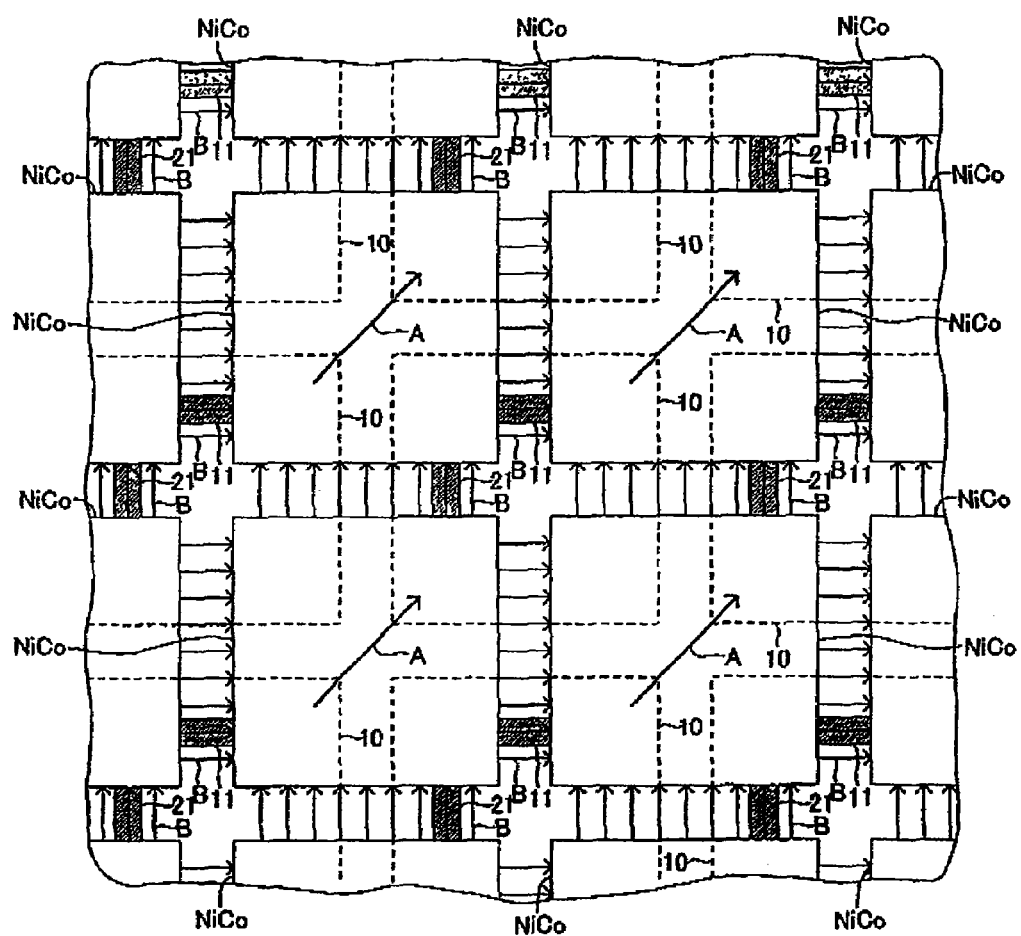
FIG. 13 is a schematic plan view of the magnetic sensor according to embodiment 1 at one stage during the production.

FIG. 13 is a plan view of the wafer in this state. Here, in FIG. 13, each of the substrates that will be separated from each other by a later dicing process are denoted with the reference numeral 10 for convenience sake. Referring to FIG. 13, by the previous patterning of the resist, the magnetic-field-applying magnetic layers (NiCo) are each formed to have a generally square shape with its center located at the center of four adjacent substrates 10 which will be separated from each other later, and are disposed so as to exclude parts (its portions) located immediately above the magnetic tunnel effect elements (groups) 11, 21 in the longitudinal direction and in the lateral direction (i.e. so as to sandwich the layer, having the predetermined configuration, that will be the magnetic tunnel effect elements (groups) 11, 21 where the lower magnetic layer SJ including the magnetic layer that will be the pinned layer is formed in a plan view). In this state, a magnetic field having a strength of about 1000 (Oe) is given in the direction parallel to the diagonal line of the square that each magnetic-field-applying magnetic layer forms, so as to magnetize the magnetic-field-applying magnetic layer in the direction shown by arrow A in FIG. 13.

Next, the aforesaid magnetic field is removed. At this time, the residual magnetization of the magnetic-field-applying magnetic layer generates a magnetic field in the direction from the upper side of each magnetic-field-applying magnetic layer to the lower side of an adjacent magnetic-field-applying magnetic layer and a magnetic field in the direction from the right side of each magnetic-field-applying magnetic layer to the left side of an adjacent magnetic-field-applying magnetic layer, as shown by arrows B in FIG. 13. For this reason, to the parts that will become the magnetic tunnel effect elements (groups) 11, 21, a magnetic field parallel to the longitudinal direction of the parts is applied. Then, in order to form the antiferromagnetic film 13 made of PtMn into an ordered alloy and to impart an exchange coupling magnetic field Hex, a high-temperature annealing process is carried out to put the wafer into a high-temperature environment. As a result of this, the magnetic tunnel effect elements (groups) 11, 21 formed on one and the same substrate 10 will have pinned layers that are magnetized (pinned) in different directions from each other (in this case, in the directions that are perpendicular to each other). In other words, the magnetic tunnel effect elements (groups) 11, 21 will each have a fixed magnetization axis in the direction shown by the arrows in FIG. 1.

Figure 14:
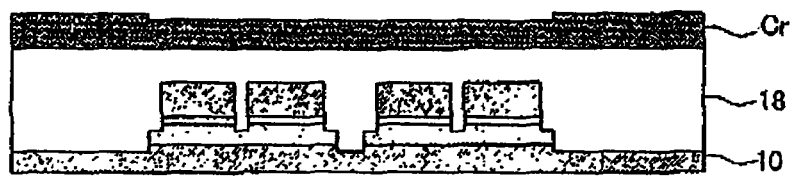
FIG. 14 is a schematic cross-sectional view of the magnetic sensor according to embodiment 1 at one stage during the production.
Figure 15:
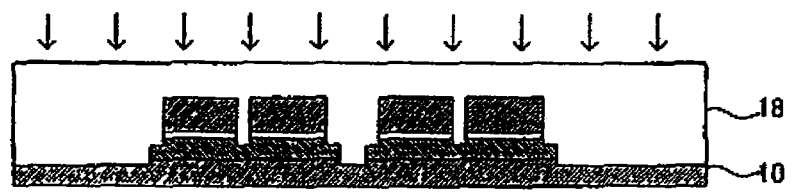
FIG. 15 is a schematic cross-sectional view of the magnetic sensor according to embodiment 1 at one stage during the production.
Figure 16:
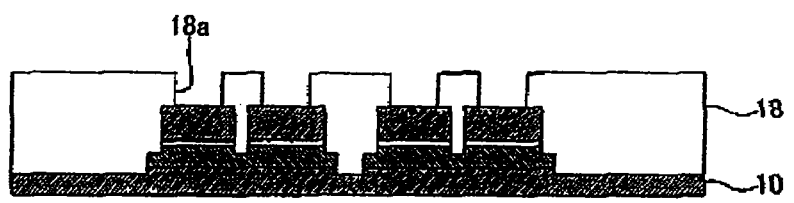
FIG. 16 is a schematic cross-sectional view of the magnetic sensor according to embodiment 1 at one stage during the production.
Figure 17:
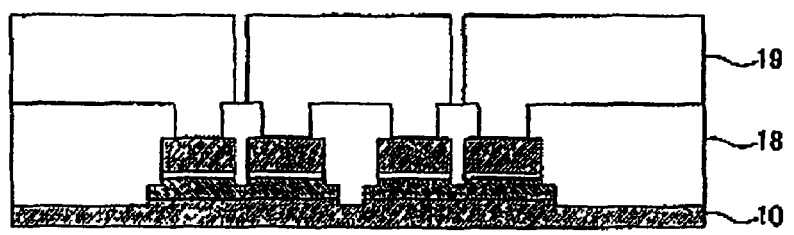
FIG. 17 is a schematic cross-sectional view of the magnetic sensor according to embodiment 1 at one stage during the production.

Subsequently, as illustrated in FIG. 14, the NiCo which is the plating film and the sputtered NiFe (which is the plating underlayer film) are removed by acid, and Cr is removed by milling, as illustrated in FIG. 15. Thereafter, as illustrated in FIG. 16, a contact hole 18a Is formed through the interlayer insulating film 18; an Al film is formed to have a thickness of 300 nm by sputtering as illustrated in FIG. 17; and the Al film is processed in a wiring pattern to form an upper electrode 19.

Figure 1:
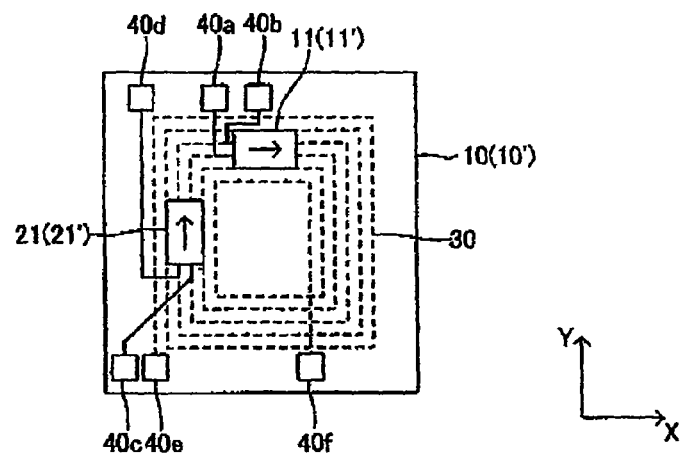
FIG. 1 is a conceptual plan view illustrating a magnetic sensor according to embodiment 1 and embodiment 2 of the present invention.

Then, electrode pads 40a to 40f illustrated in FIG. 1 are formed on the substrate 10, and the electrode pads 40a to 40f are respectively connected to the magnetic tunnel effect elements (groups) 11, 21 and the toil 30. Finally, a film (not illustrated) made of SiO having a thickness of 150 nm and a film (not illustrated) made of SiN having a thickness of 1000 nm are formed as a protective film (passivation film) by CVD. Thereafter, a part of the protective film is opened by milling, RIE, or etching using a resist mask to expose the electrode pads 40a to 40f Subsequently, the substrate is subjected to back grinding (thinning by grinding); the substrate is separated into individual magnetic sensors by dicing; and finally, the packaging is carried out.

Figure 18:
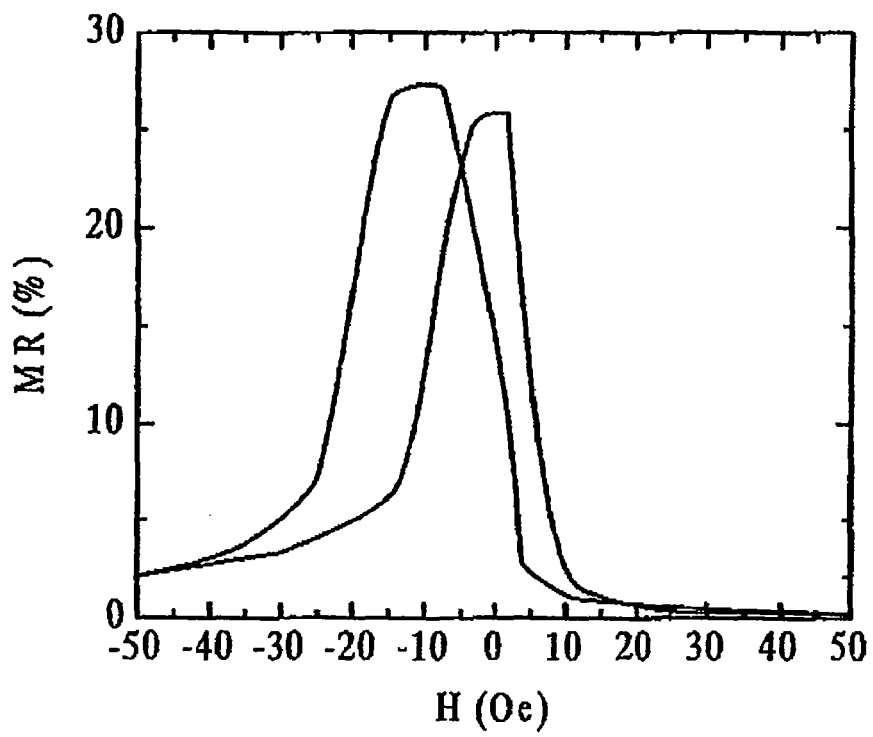
FIG. 18 is a graph depicting the change of the MR ratio of one magnetic tunnel effect element (group) shown in FIG. 1 when an external magnetic field changing in magnitude in the longitudinal direction (X-axis direction) of the element is applied to the element.
Figure 19:
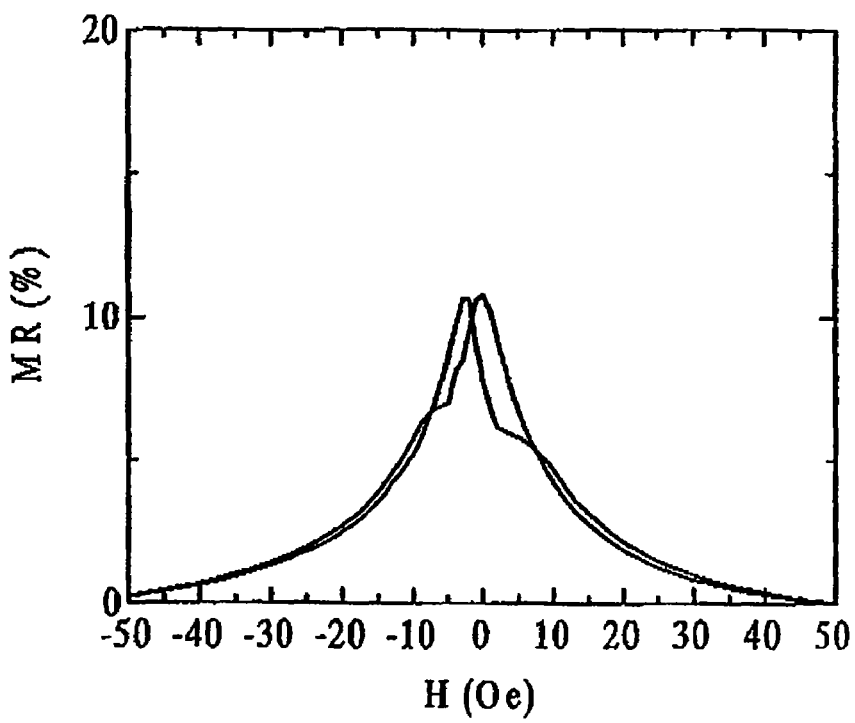
FIG. 19 is a graph depicting the change of the MR ratio of one magnetic tunnel effect element (group) shown in FIG. 1 when an external magnetic field changing in magnitude in the direction (Y-axis direction) perpendicular to the longitudinal direction of the element is applied to the element.

To the magnetic tunnel effect element (group) 11 thus produced and shown in FIG. 1, external magnetic fields changing in magnitude along the respective axes in the X-axis direction shown in FIG. 1 and in the Y-axis direction perpendicular to the X-axis were applied, so as to measure the resistance changing ratio MR (MR ratio) at the time the magnetic fields were applied. The results are shown in FIGS. 18 and 19. As will be clear from FIGS. 18 and 19, the MR ratio of the magnetic tunnel effect element (group) 11 changed more greatly in response to the external magnetic field changing in the X-axis direction than to the external magnetic field changing in the Y-axis direction. This has confirmed that, in the magnetic tunnel effect element (group) 11, the magnetization direction of the pinned layer thereof is parallel to the X-axis.

Figure 20:
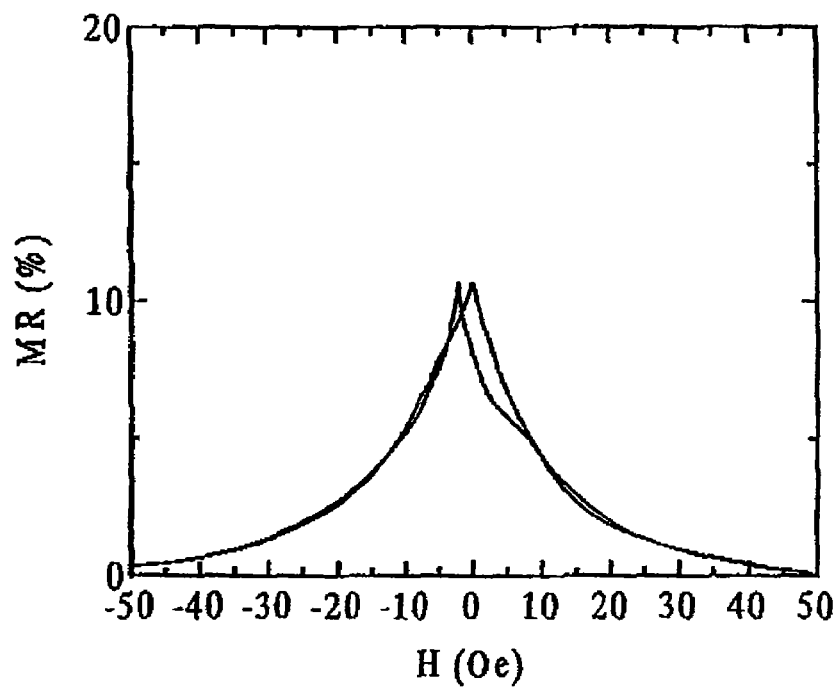
FIG. 20 is a graph depicting the change of the MR ratio of the other magnetic tunnel effect element (group) shown in FIG. 1 when an external magnetic field changing in magnitude in the direction (X-axis direction) perpendicular to the longitudinal direction of the element is applied to the element.
Figure 21:
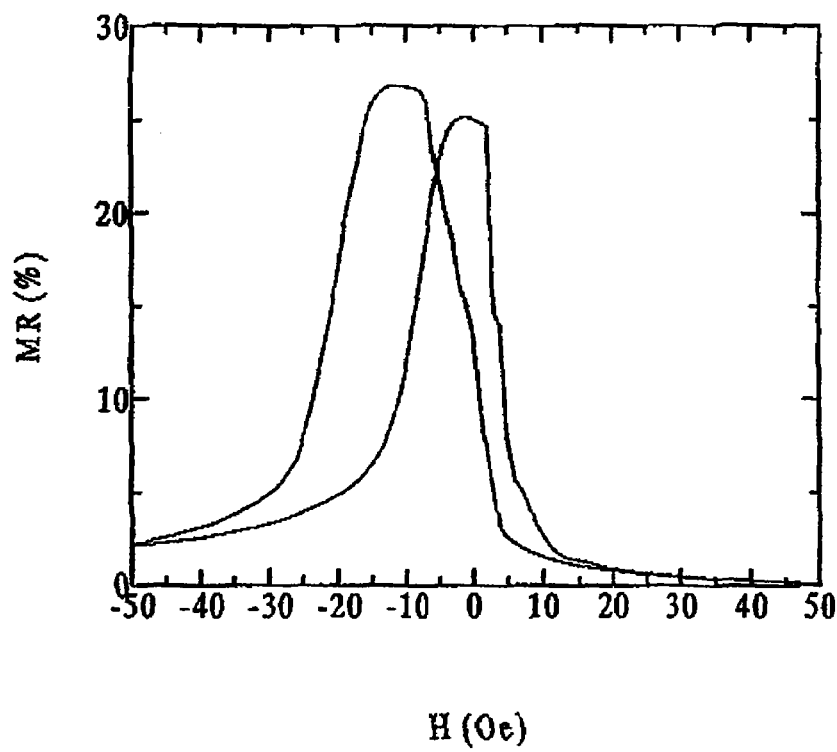
FIG. 21 is a graph depicting the change of the MR ratio of the other magnetic tunnel effect element (group) shown in FIG. 1 when an external magnetic field changing in magnitude in the longitudinal direction (Y-axis direction) of the element is applied to the element.

Similarly, to the magnetic tunnel effect element (group) 21 shown in FIG. 1, external magnetic fields changing in magnitude along the respective axes in the X-axis direction and in the Y-axis direction were applied, so as to measure the resistance changing ratio MR (MR ratio) at the time the magnetic fields were applied. The results are shown in FIGS. 20 and 21. As will be clear from FIGS. 20 and 21, the MR ratio of the magnetic tunnel effect element (group) 21 changed more greatly in response to the external magnetic field changing in the Y-axis direction than to the external magnetic field changing in the X-axis direction. This has confirmed that, in the magnetic tunnel effect element (group) 21, the magnetization direction of the pinned layer thereof is parallel to the Y-axis. In other words, it has been confirmed that, on one and the same substrate 10, this magnetic sensor has two magnetic tunnel effect elements (magnetoresistance effect elements) having pinned layers that are pinned so that the magnetization directions thereof are different from each other (i.e. so that the magnetization directions thereof cross each other).

Next, a magnetic sensor according to the second embodiment will be described. The second embodiment is different from the first embodiment only in that, whereas the fixed magnetization layer of the first embodiment is constituted with PtMn and NiFe, the fixed magnetization layer of the second embodiment is constituted with a film made of MnRh having a thickness of 30 nm and a film made of NiFe (pinned layer) having a thickness of 40 nm. On the other hand, by this difference in the material of the fixed magnetization layer, the method of producing the second embodiment is a little different from that of the first embodiment, which will be described as follows.

Figure 22:
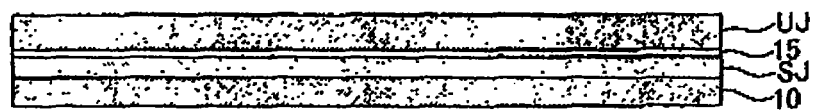
FIG. 22 is a schematic cross-sectional view of the magnetic sensor according to embodiment 2 at one stage during the production.

Namely, in the second embodiment, as illustrated in FIG. 22, a film made of Ta having a thickness of 30 nm, a film made of MnRh having a thickness of 30 nm, and a film made of NiFe having a thickness of 40 nm are formed on a substrate 10 by sputtering so as to form a lower magnetic layer SJ. Subsequently, an Al film of 1 nm is formed and oxidized to form an insulating layer 15. A film made of NiFe having a thickness of 40 nm and a film made of Ta having a thickness of 40 nm are formed thereon so as to form an upper magnetic layer UJ.

Figure 23:
FIG. 23 is a schematic cross-sectional view of the magnetic sensor according to embodiment 2 at one stage during the production.
Figure 24:
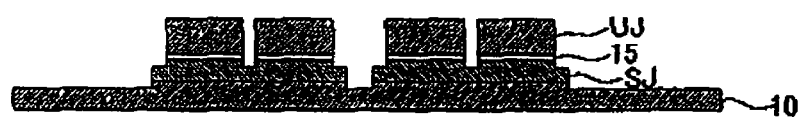
FIG. 24 is a schematic cross-sectional view of the magnetic sensor according to embodiment 2 at one stage during the production.
Figure 25:
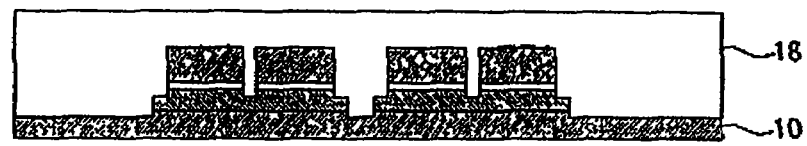
FIG. 25 is a schematic cross-sectional view of the magnetic sensor according to embodiment 2 at one stage during the production.
Figure 26:
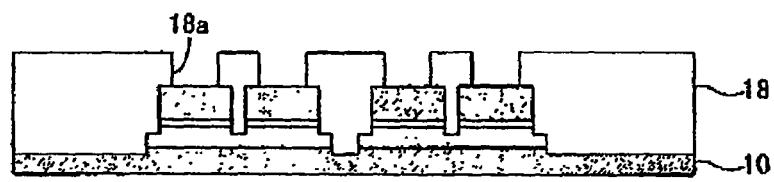
FIG. 26 is a schematic cross-sectional view of the magnetic sensor according to embodiment 2 at one stage during the production.
Figure 27:
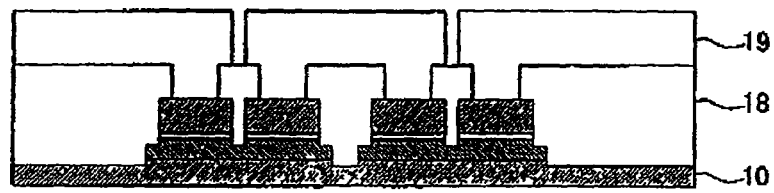
FIG. 27 is a schematic cross-sectional view of the magnetic sensor according to embodiment 2 at one stage during the production.
Figure 28:
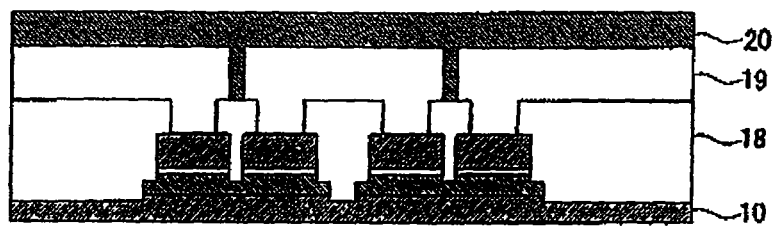
FIG. 28 is a schematic cross-sectional view of the magnetic sensor according to embodiment 2 at one stage during the production.

Subsequently, as illustrated in FIG. 23, the upper magnetic layer UJ is processed for separation, and the lower magnetic layer SJ is processed for separation, as illustrated in FIG. 24. Next, as illustrated in FIG. 25, SiO.sub.2 is sputtered to form a film having a thickness of 250 nm so as to form an interlayer insulating layer 18, and successively a contact hole 18a is formed through the interlayer insulating layer 18, as illustrated in FIG. 26. Subsequently, as illustrated in FIG. 27, Al is sputtered to form a film having a thickness of 300 nm and processed in a wiring pattern to form an upper electrode 19. Then, as illustrated in FIG. 28, a protective film 20 made of SiO and SiN is formed by CVD.

Figure 29:
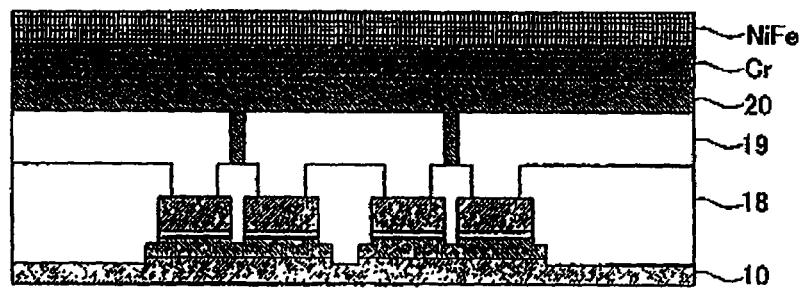
FIG. 29 is a schematic cross-sectional view of the magnetic sensor according to embodiment 2 at one stage during the production.
Figure 30:
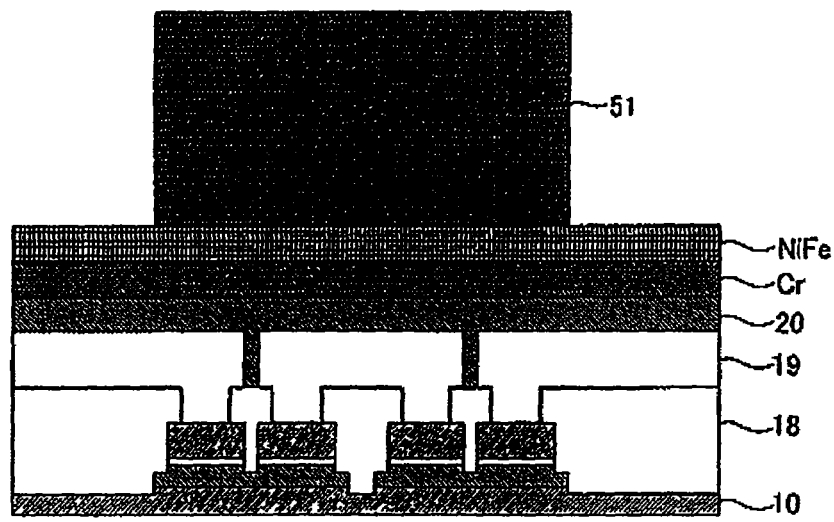
FIG. 30 is a schematic cross-sectional view of the magnetic sensor according to embodiment 2 at one stage during the production.

Next, as illustrated in FIG. 29, a film made of Cr and a film made of NiFe are formed by sputtering to have a thickness of 100 nm and 50 nm, respectively, as a plating underlayer film, and successively, a resist 51 is applied, as illustrated in FIG. 30. The resist 51 is patterned into a predetermined shape so as not to cover the part where the plating will be carried out later.

Figure 31:
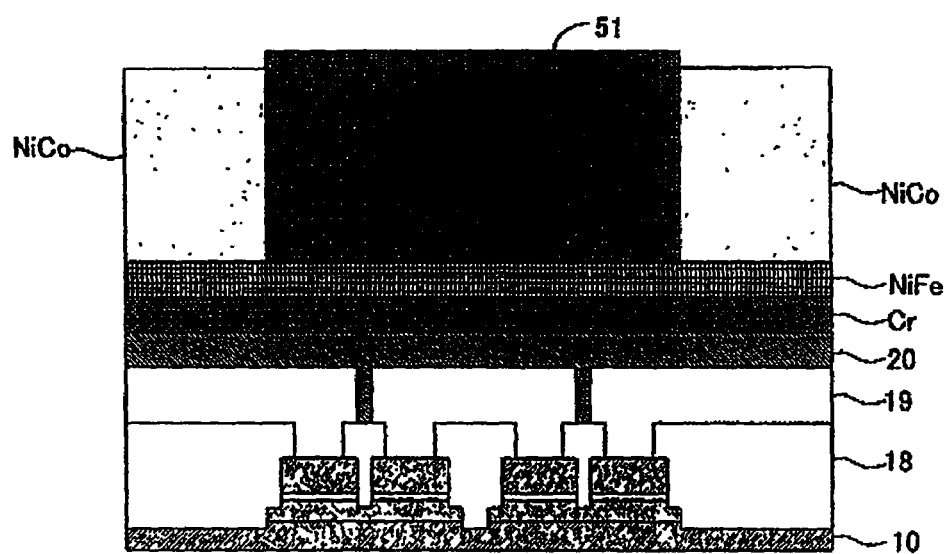
FIG. 31 is a schematic cross-sectional view of the magnetic sensor according to embodiment 2 at one stage during the production.
Figure 32:
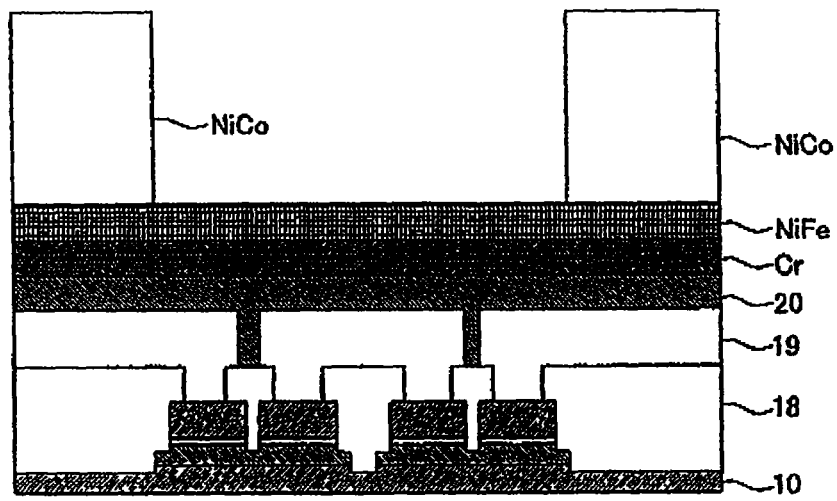
FIG. 32 is a schematic cross-sectional view of the magnetic sensor according to embodiment 2 at one stage during the production.
Figure 33:
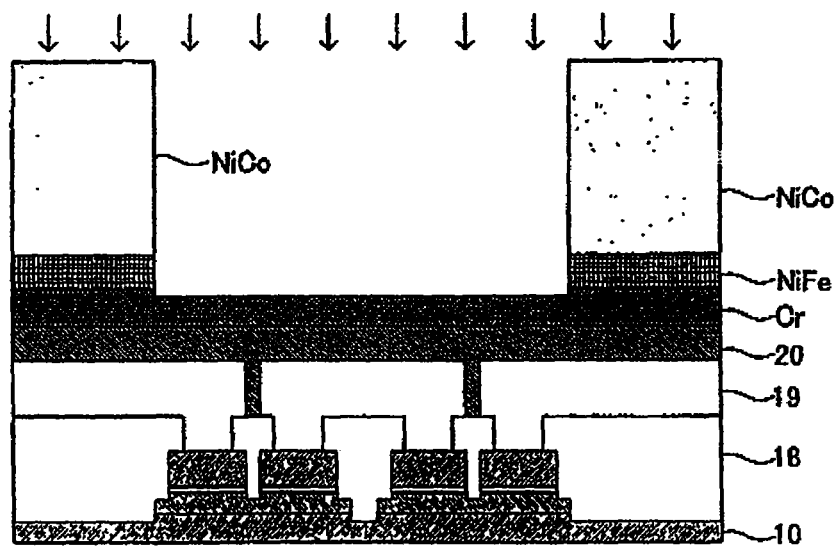
FIG. 33 is a schematic cross-sectional view of the magnetic sensor according to embodiment 2 at one stage during the production.

Next, as illustrated in FIG. 31, the wafer is plated with NICO as a magnetic-field-applying magnetic layer. The thickness of NiCo is, for example, set to be 10 .mu.m. Then, after the resist is removed as illustrated in FIG. 32, the entire surface is subjected to milling (Ar milling) to remove NiFe formed as the plating underlayer film, as illustrated in FIG. 33. At this stage, the wafer is in the state shown in FIG. 13. In this state, a magnetic field having a strength of about 1000 (Oe) is given in the direction parallel to the diagonal line of the square that each magnetic-field-applying magnetic layer forms, so as to magnetize the magnetic-field-applying magnetic layer in the direction shown by arrow A in FIG. 13. Thereafter, the magnetic field is removed.

Figure 34:
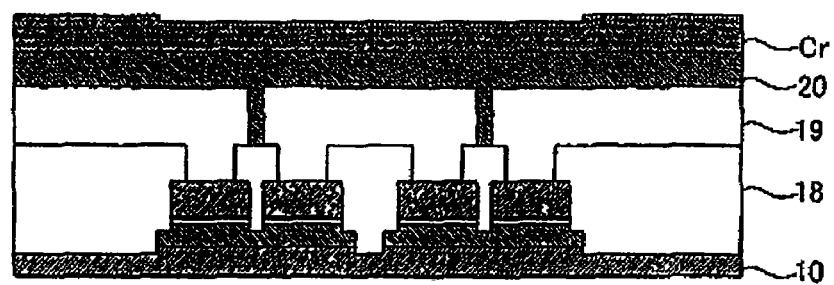
FIG. 34 is a schematic cross-sectional view of the magnetic sensor according to embodiment 2 at one stage during the production.
Figure 35:
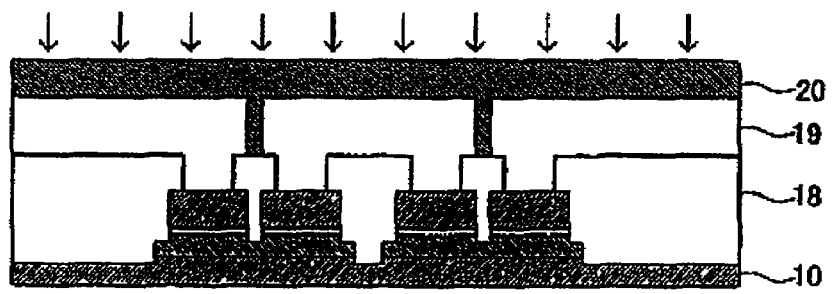
FIG. 35 is a schematic cross-sectional view of the magnetic sensor according to embodiment 2 at one stage during the production.

At this time, to the parts that will later become the magnetic tunnel effect elements (groups) 11', 21', a magnetic field parallel to the longitudinal direction of the parts is applied by the residual magnetization of NiCo. Then, a high-temperature annealing process is carried out to put the wafer into a high-temperature environment. As a result of this, the magnetic tunnel effect elements (groups) 11', 21' formed on one and the same substrate 10' will have pinned layers that are magnetized (pinned) in different directions from each other (in this case, in the directions that are perpendicular to each other). After the high-temperature annealing process is finished, the plating film NiCo and the plating underlayer film NiFe are removed by acid as illustrated in FIG. 34, and the plating underlayer film Cr Is removed by milling, as illustrated in FIG. 35. Thereafter, a process similar to that of the first embodiment is carried out.

Figure 36:
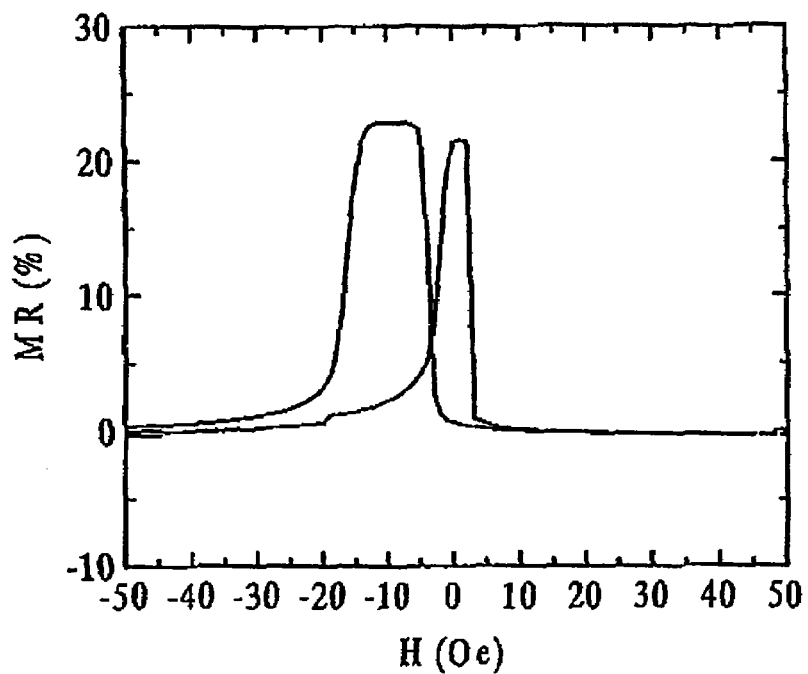
FIG. 36 is a graph depicting the change of the MR ratio of one magnetic tunnel effect element (group) according to embodiment 2 when an external magnetic field changing in magnitude in the longitudinal direction (X-axis direction in FIG. 1) of the element is applied to the element.
Figure 37:
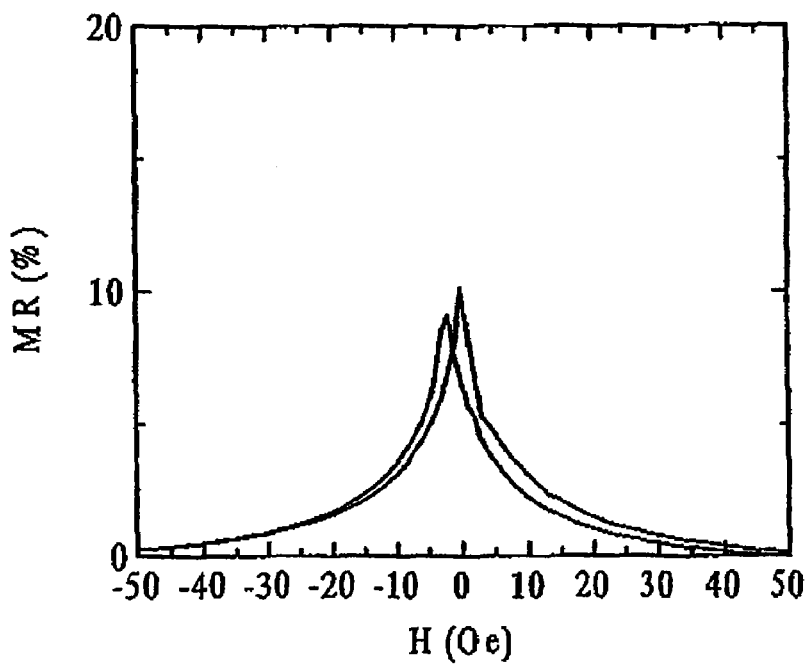
FIG. 37 is a graph depicting the change of the MR ratio of one magnetic tunnel effect element (group) according to embodiment 2 when an external magnetic field changing in magnitude in the direction (Y-axis direction in FIG. 1) perpendicular to the longitudinal direction of the element is applied to the element.

To the magnetic tunnel effect element (group) 11' thus produced and shown in FIG. 1, external magnetic fields changing in magnitude along the respective axes in the X-axis direction and in the Y-axis direction were applied, so as to measure the resistance changing ratio MR (MR ratio) at the time the magnetic fields were applied. The results are shown in FIGS. 36 and 37. As will be clear from FIGS. 36 and 37, the MR ratio of the magnetic tunnel effect element (group) 11' changed more greatly in response to the external magnetic field changing in the X-axis direction than to the external magnetic field changing in the Y-axis direction. This has confirmed that, in the magnetic tunnel effect element (group) 11'. the magnetization direction of the pinned layer thereof is parallel to the X-axis.

Figure 38:
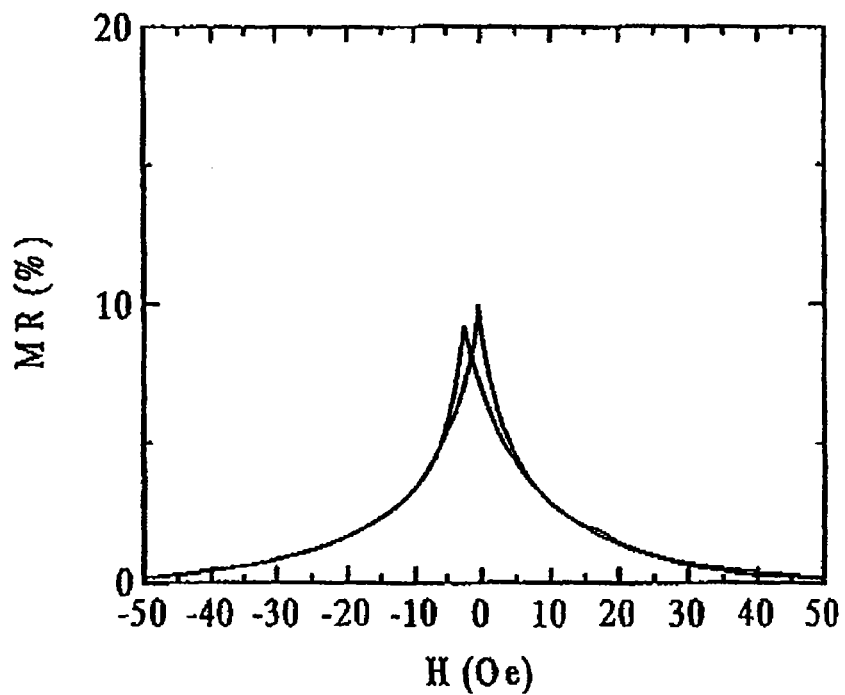
FIG. 38 is a graph depicting the change of the MR ratio of the other magnetic tunnel effect element (group) according to embodiment 2 when an external magnetic field changing in magnitude in the direction (X-axis direction in FIG. 1) perpendicular to the longitudinal direction of the element is applied to the element.
Figure 39:
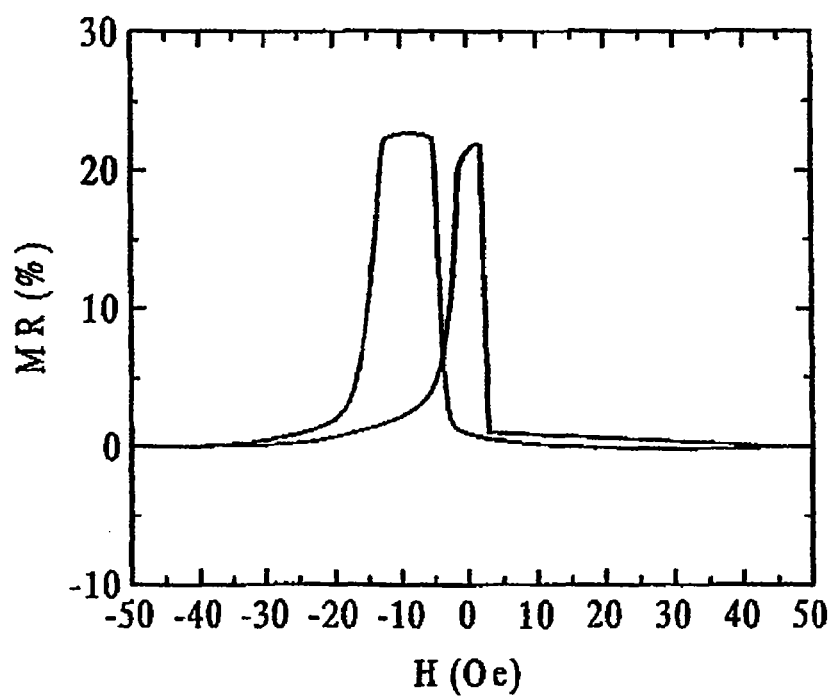
FIG. 39 is a graph depicting the change of the MR ratio of the other magnetic tunnel effect element (group) according to embodiment 2 when an external magnetic field changing in magnitude in the longitudinal direction (Y-axis direction in FIG. 1) of the element is applied to the element.

Similarly, to the magnetic tunnel effect element (group) 21' shown in FIG. 1. external magnetic fields changing in magnitude along the respective axes in the X-axis direction and in the Y-axis direction were applied, so as to measure the resistance changing ratio MR (MR ratio) at the time the magnetic fields were applied. The results are shown in FIGS. 38 and 39. As will be clear from FIGS. 38 and 39, the MR ratio of the magnetic tunnel effect element (group) 21' changed more greatly in response to the external magnetic field changing in the Y-axis direction than to the external magnetic field changing in the X-axis direction. This has confirmed that, in the magnetic tunnel effect element (group) 21', the magnetization direction of the pinned layer thereof is parallel to the Y-axis. In other words, it has been confirmed that, on one and the same substrate 10', this magnetic sensor according to the second embodiment has two magnetic tunnel effect elements (magnetoresistance effect elements) having pinned layers that are pinned so that the magnetization directions thereof cross each other (i.e. are different from each other).

As described above, the magnetic sensors according to the first and second embodiments have, on one and the same substrate (on a single chip), magnetic tunnel effect elements in which the magnetization directions of the pinned layers cross each other (i.e. the magnetization directions of at least two of the pinned layers form an angle other than 0.degree. and 180.degree.). For this reason, these magnetic sensors can be used as a small magnetic sensor (for example, as a geomagnetism sensor or the like) that is requested to detect magnetic fields in different directions. Also, according to the methods of the above-described embodiments, these sensors can be easily produced.

Here, in the first embodiment, since PtMn is used in the fixed magnetization layer as a pinning layer, the magnetization direction of the pinned layer in the fixed magnetization layer must be pinned at the timing at which the wafer is initially brought to a high temperature. Therefore, in the first embodiment, the wafer is subjected to a high-temperature annealing process at a stage prior to the high-temperature process by CVD or the like that is carried out for forming the protective film. In contrast, in the second embodiment, MnRh is used as a pinning layer of the fixed magnetization layer. The MnRh film will be deteriorated in quality if another high-temperature process is carried out after the high-temperature annealing process. Therefore, in the second embodiment, the high-temperature annealing process is carried out after the high-temperature process by CVD or the like for forming the protective film is carried out.

Figure 40:
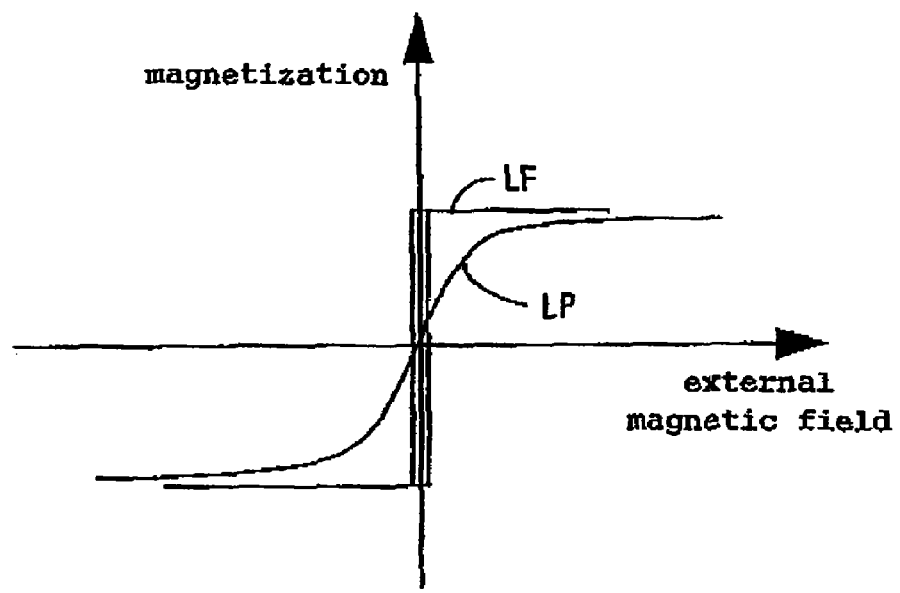
FIG. 40 is a graph depicting the magnetization curves of a pinned layer and a free layer when a magnetic field changing in magnitude within the direction perpendicular to the magnetization direction of die pinned layer is applied to a magnetic tunnel effect element group according to embodiment 1 and 2.

Further, according to the above-described production methods of the first and second embodiments, one can obtain a magnetic tunnel effect element (group) that exhibits an even-function property to an external magnetic field to be detected. In other words, when a magnetic field changing in magnitude within the direction perpendicular to the magnetization direction of the pinned layer is applied to the magnetic tunnel effect element groups 11, 21, 11', 21', the magnetization of the pinned layer changes smoothly as illustrated by the line LP of FIG. 40. On the other hand, the free layer of these elements reacts sensitively to the direction of the aforesaid external magnetic field due to the shape anisotropy, and the magnetization of the free layer changes in a stepwise manner when the magnitude of the external magnetic field approaches the neighborhood of "0", as illustrated by the line LF of FIG. 40. As a result of this, the relative angle formed between the magnetization direction of the pinned layer and the magnetization direction of the free layer attains the maximum value (approximately 90.degree.) when the external magnetic field is "0" and, according as the magnitude (absolute value) of the external magnetic field increases, the relative angle decreases. This can be confirmed by FIGS. 19, 20, 37, and 38.

Figure 41:
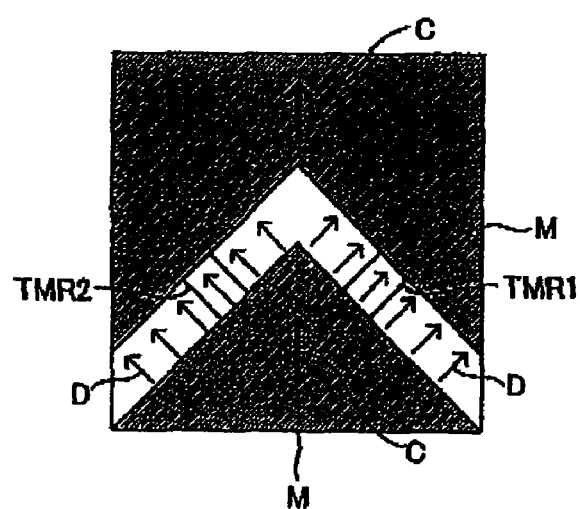
FIG. 41 is a plan view of another substrate, according to the present invention, having a differently configured plating film formed thereon.

Further, as will be also clear from FIG. 13, when a plating film (NiCo) constituting each magnetic-field-applying magnetic layer is magnetized in a predetermined direction shown by arrow A in FIG. 13, the direction of the magnetic field generated between the plating films by the residual magnetization of the plating films will be different from the magnetization direction of the plating films but will be the direction perpendicular to the end surfaces of the plating films M as shown by arrows B in FIG. 13. Therefore, if the end surface shape of the plating films M is designed, for example, as shown in FIG. 41 and the plating films are magnetized in the direction shown by arrow C, a magnetic field having a desired direction (direction shown by arrows D) can be locally generated at a suitable position on the wafer. Therefore, by using this, one can produce magnetic tunnel effect elements TMR1, TMR2 having fixed magnetization axes in desired directions on a single substrate (magnetic tunnel effect elements TMR1, TMR2 in which the magnetization directions of the pinned layers cross each other on a single chip).

Next, a magnetic sensor according to the third embodiment of the present invention will be described. While the magnetic sensors of the above-described first and second embodiments are constituted with TMR elements, the magnetic sensor of the third embodiment is constituted with GMR elements. Further, this magnetic sensor is provided with an X-axis magnetic sensor for detecting a magnetic field in the X-axis direction and a Y-axis magnetic sensor for detecting a magnetic field in the Y-axis direction perpendicular to the aforesaid X-axis.

Figure 42:
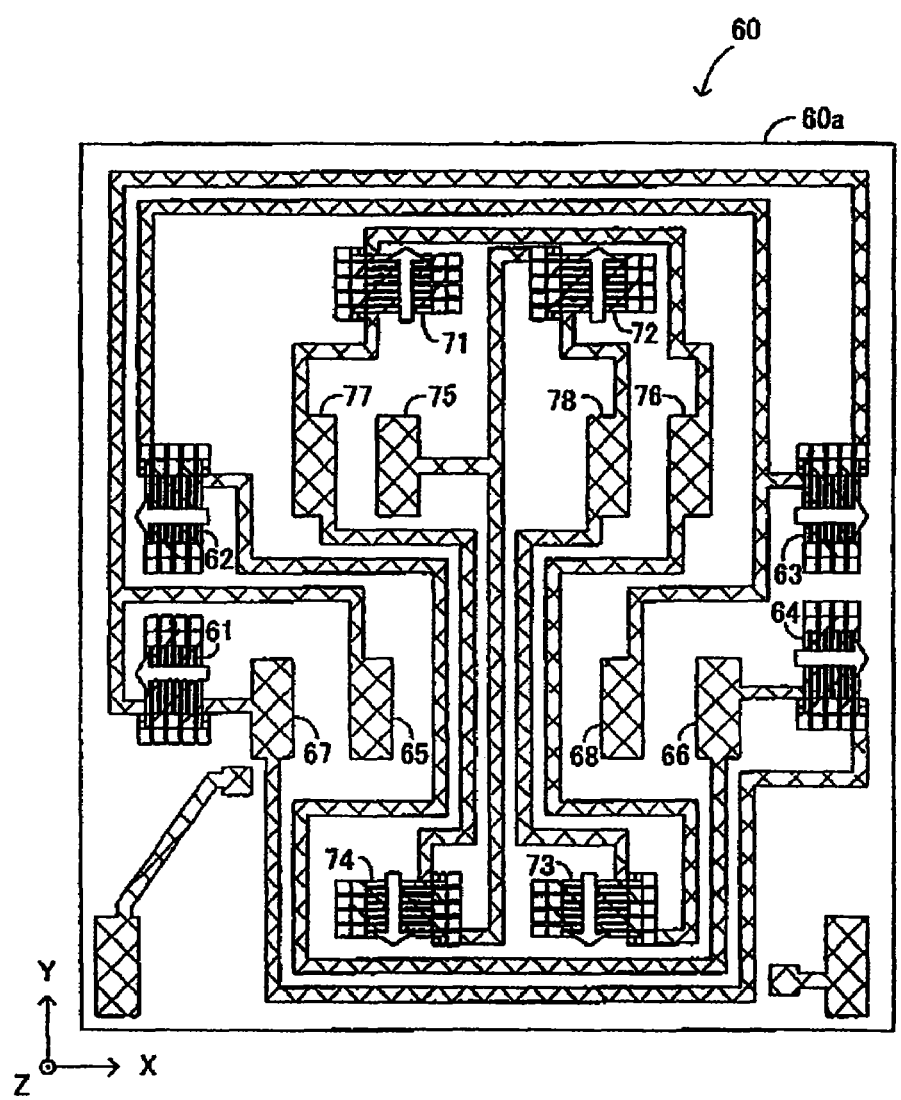
FIG. 42 is a schematic plan view of a magnetic sensor according to embodiment 3 of the present invention.

More specifically described, this magnetic sensor 60 has a rectangular (generally square) shape having sides along the X-axis and the Y-axis that are perpendicular to each other in a plan view as illustrated in FIG. 42, and includes a single chip (same substrate) 60a made of quartz glass having a small thickness in the Z-axis direction perpendicular to the X-axis and the Y-axis, a sum of eight GMR elements 61 to 64, 71 to 74 formed on the chip 60a, a sum of eight pads 65 to 68, 75 to 78 formed on the chip 60a, and a connecting line that connects the pads and the elements.

The first X-axis GMR element 61 is formed in a neighborhood of the end of the chip 60a in the negative direction of the X-axis and a little below a generally central part of the chip 60a in the Y-axis direction, and the pinned magnetization direction of the pinned layer is in the negative direction of the X-axis, as illustrated by an arrow in FIG. 42. The second X-axis GMR element 62 is formed in a neighborhood of the end of the chip 60a in the negative direction of the X-axis and a little above a generally central part of the chip 60a in the Y-axis direction, and the pinned magnetization direction of the pinned layer is in the negative direction of the X-axis, as illustrated by an arrow in FIG. 42. The third X-axis GMR element 63 is formed in a neighborhood of the end of the chip 60a in the positive direction of the X-axis and a little above a generally central part of the chip 60a in the Y-axis direction, and the pinned magnetization direction of the pinned layer is in the positive direction of the X-axis, as illustrated by an arrow in FIG. 42. The fourth X-axis GMR element 64 is formed in a neighborhood of the end of the chip 60a in the positive direction of the X-axis and a little below a generally central part of the chip 60a in the Y-axis direction, and the pinned magnetization direction of the pinned layer is in the positive direction of the X-axis, as illustrated by an arrow in FIG. 42.

The first Y-axis GMR element 71 is formed in a neighborhood of the end of the chip 60a in the positive direction of the Y-axis and a little to the left of a generally central part of the chip 60a in the X-axis direction, and the pinned magnetization direction of the pinned layer is in the positive direction of the Y-axis, as illustrated by an arrow in FIG. 42. The second Y-axis GMR element 72 is formed in a neighborhood of the end of the chip 60a in the positive direction of the Y-axis and a little to the right of a generally central part of the chip 60a in the X-axis direction, and the pinned magnetization direction of the pinned layer is in the positive direction of the Y-axis, as illustrated by an arrow in FIG. 42. The third Y-axis GMR element 73 is formed in a neighborhood of the end of the chip 60a in the negative direction of the Y-axis and a little to the right of a generally central part of the chip 60a in the X-axis direction, and the pinned magnetization direction of the pinned layer is in the negative direction of the Y-axis, as illustrated by ah arrow in FIG. 42. The fourth Y-axis GMR element 74 is formed in a neighborhood of the end of the chip 60a in the negative direction of the Y-axis and a little to the left of a generally central part of the chip 60a in the X-axis direction, and the pinned magnetization direction of the pinned layer is in the negative direction of the Y-axis, as illustrated by an arrow in FIG. 42.

The GMR elements 61 to 64, 71 to 74 have substantially the same structure with each other except that the position thereof on the chip 60a and the pinned magnetization direction of the pinned layer relative to the chip 60a are different. Therefore, the structure thereof will be described hereafter using the first X-axis GMR element 61 as a representative example.

Figure 43:
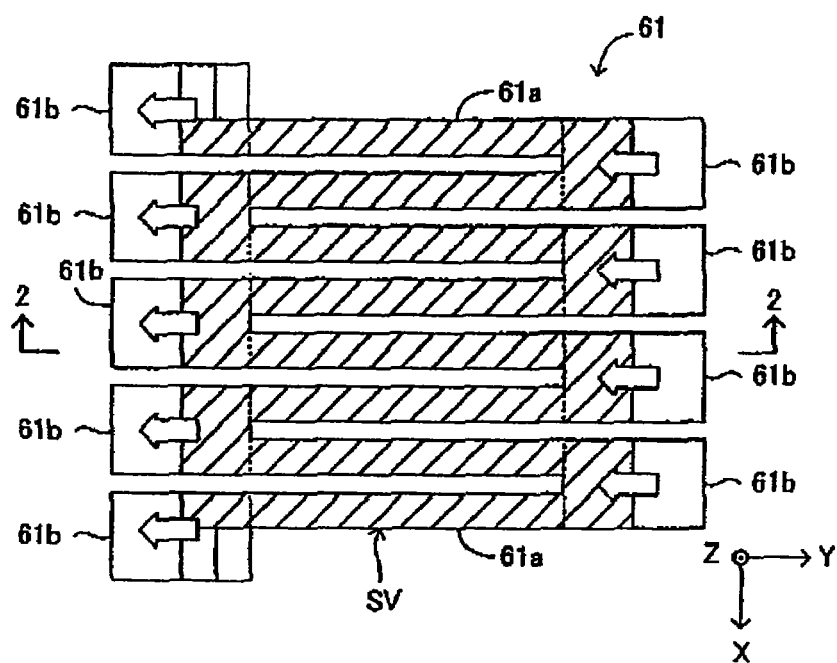
FIG. 43 is a schematic enlarged plan view of the first X-axis GMR element shown in FIG. 42.
Figure 44:
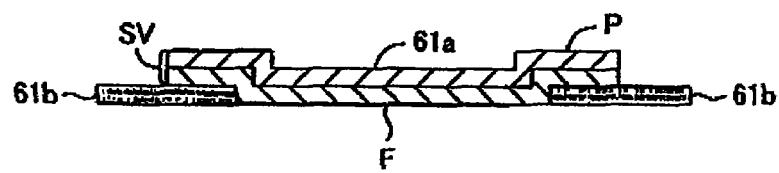
FIG. 44 is a schematic cross-sectional view of the first X-axis GMR element shown in FIG. 43 and cut with a plane along the line 2-2 of FIG. 43.

The first X-axis GMR element 61 includes a plurality of narrow band-shaped parts 61 . . . 61a made of a spin valve film SV and having a longitudinal direction in the Y-axis direction and bias magnet films (hard ferromagnetic thin film layers) 61b . . . 61b made of a hard ferromagnetic material such as CoCrPt formed under the two ends of each narrow band-shaped part 61a in the Y-axis direction and having a high magnetic coercive force and a high square ratio, as illustrated in FIG. 43 which is a plan view and in FIG. 44 which is a schematic cross-sectional view of the first X-axis GMR element 61 cut with a plane along the line 2-2 of FIG. 43. Each of the narrow band-shaped parts 61a . . . 61a extends in the X-axis direction on the upper surface of each bias magnet film 61b and is bonded to an adjacent narrow band-shaped part 61a.

Figure 45:
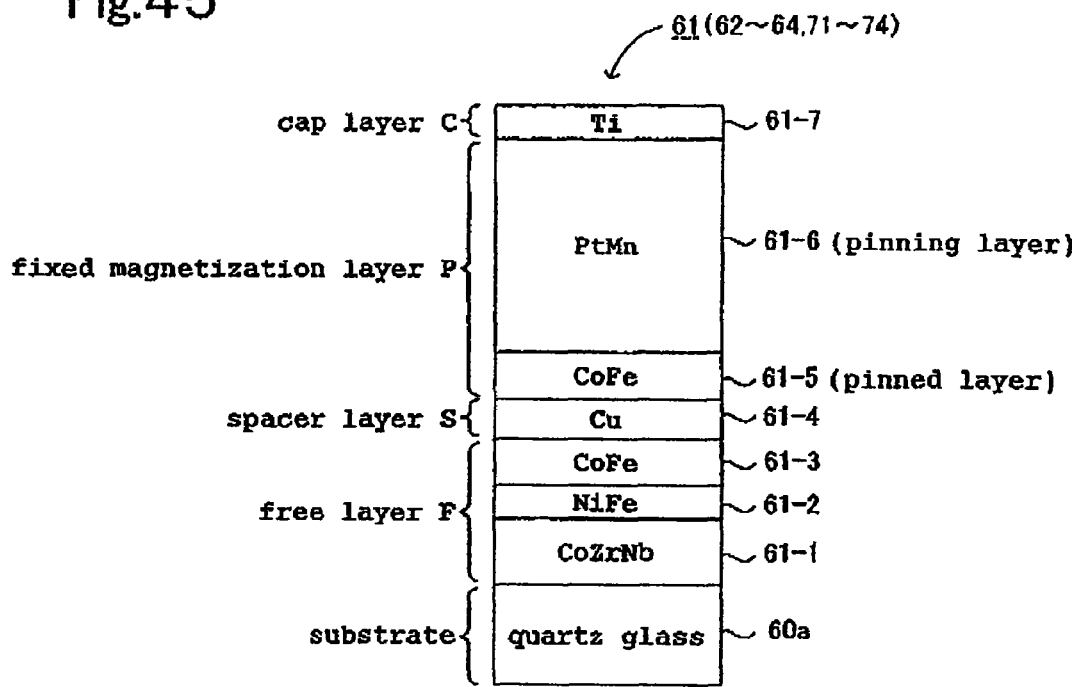
FIG. 45 is a view illustrating a construction of a spin valve film of the first X-axis GMR element shown in FIG. 43.

The spin valve film SV of the first X-axis GMR element 61 is, as shown by the film construction in FIG. 45, composed of a free layer (free magnetization layer) F. an electrically conductive spacer layer S made of Cu having a thickness of 2.4 nm (24 .ANG.), a fixed magnetization layer P, and a cap layer C made of titanium (Ti) or tantalum (Ta) having a thickness of 2.5 nim (25 .ANG.) which are successively laminated on a chip 60a constituting a substrate.

The free layer F is a layer whose magnetization direction changes in accordance with the direction of an external magnetic field, and is composed of a CoZrNb amorphous magnetic layer 61-1 formed immediately above the substrate 60a and having a thickness of 8 nm (80 .ANG.). a NiFe magnetic layer 61-2 formed on the CoZrNb amorphous magnetic layer 61-1 and having a thickness of 3.3 nm (33 .ANG.), and a CoFe layer 61-3 formed on the NiFe layer 61-2 and having a thickness of about 1 to 3 nm (10 to 30 .ANG.). The CoZrNb amorphous magnetic layer 61-1 and the NiFe magnetic layer 61-2 constitute a soft ferromagnetic thin film layer. The CoFe layer 61-3 is for preventing diffusion of Ni in the NiFe layer 61-2 and Cu 61-4 in the spacer layer S. Here, the above-described bias magnet films 61b . . . 61b apply a bias magnetic field to the free layer F in the Y-axis direction (right and left directions shown by arrows in FIG. 43) for maintaining the uniaxial anisotropy of the free layer F.

The fixed magnetization layer P is a lamination of a CoFe magnetic layer 61-5 having a thickness of 2.2 nm (22 .ANG.) and an antiferromagnetic film 61-6 formed from a PtMn alloy containing 45 to 55 mol % of Pt and having a thickness of 24 nm (240 .ANG.). The CoFe magnetic layer 61-5 is lined with the magnetized antiferromagnetic film 61-6 in an exchange coupling manner so as to constitute a pinned layer whose magnetization direction (magnetization vector) is pinned (fixed) in the negative direction of the X-axis.

Figure 46:
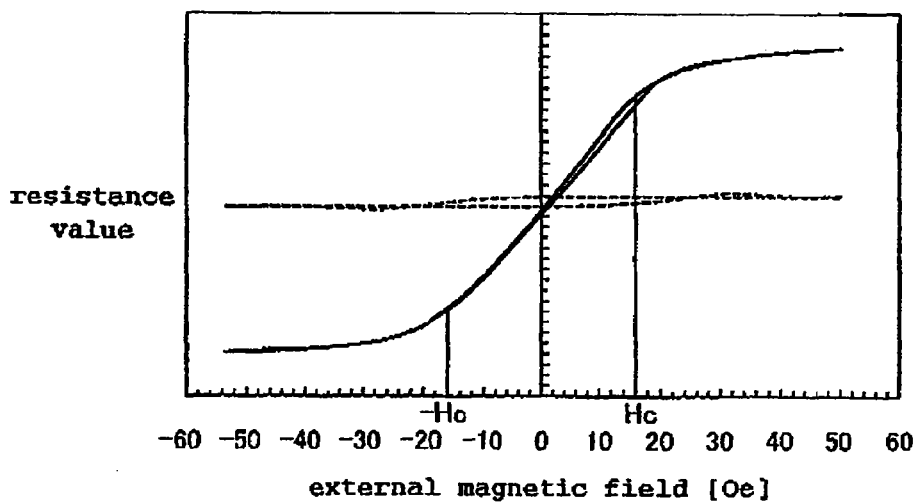
FIG. 46 is a graph depicting the change in the resistance value (solid line) of the first X-axis GMR element shown in FIG. 43 relative to a magnetic field changing in the X-axis direction and the change in the resistance value (broken line) of the element relative to a magnetic field changing in the Y-axis direction.

The first X-axis GMR element 61 thus constructed exhibits a resistance value that changes generally in proportion to an external magnetic field that changes along the X-axis in the range from –Hc to +Hc, as shown by a solid line in FIG. 46, and exhibits a generally constant resistance value to an external magnetic field that changes along the Y-axis, as shown by a broken line in FIG. 46.

Figure 47:
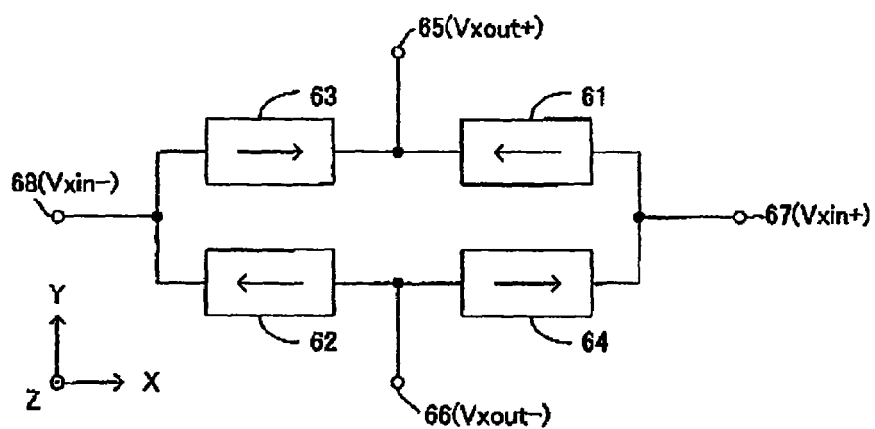
FIG. 47 is an equivalent circuit diagram of an X-axis magnetic sensor included in the magnetic sensor shown in FIG. 42.
Figure 48:
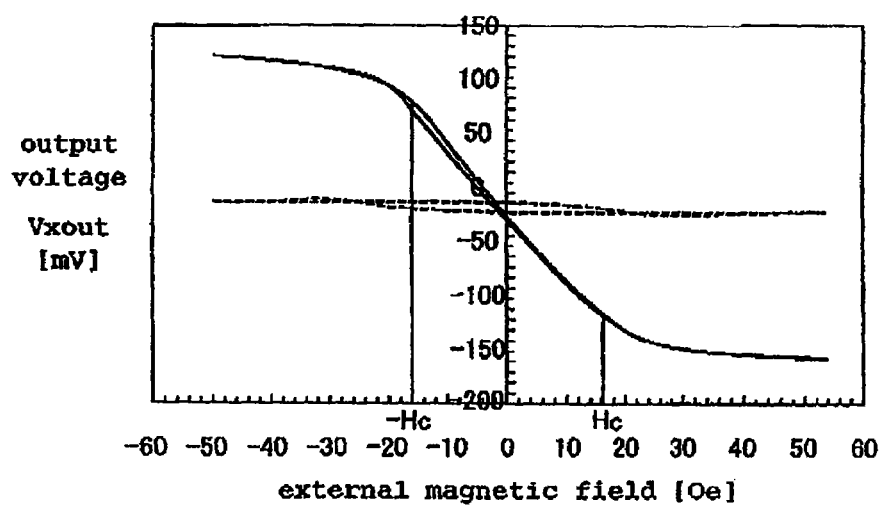
FIG. 48 is a graph depicting the change in the output voltage (solid line) of the X-axis magnetic sensor shown in FIG. 47 relative to a magnetic field changing in the X-axis direction and the change in the output voltage (broken line) of the sensor relative to a magnetic field changing in the Y-axis direction.

The X-axis magnetic sensor is constructed by full bridge connection of the first to fourth X-axis GMR elements 61 to 64, as shown by an equivalent circuit in FIG. 47. Here, in FIG. 47, the arrows show pinned magnetization directions of the pinned layers of the GMR elements 61 to 64. In such a construction, the pad 67 and the pad 68 are connected respectively to the positive electrode and the negative electrode of a constant power source (not illustrated) so as to give a voltage Vxin+ (5 V in this example) and a voltage Vxin− (0 V in this example). Then, the voltages of the pad 65 and the pad 66 are taken out as a voltage Vxout+ and a voltage Vxout−, and the voltage difference thereof (Vxout+−Vxout−) is taken out as a sensor output Vxout. As a result of this, the X-axis magnetic sensor shows an output voltage Vxout that changes generally in proportion to an external magnetic field that changes along the X-axis in the range from −Hc to +Hc, as shown by a solid line in FIG. 48, and shows a generally "0" output voltage to an external magnetic field that changes along the Y-axis, as shown by a broken line in FIG. 48.

Figure 49:
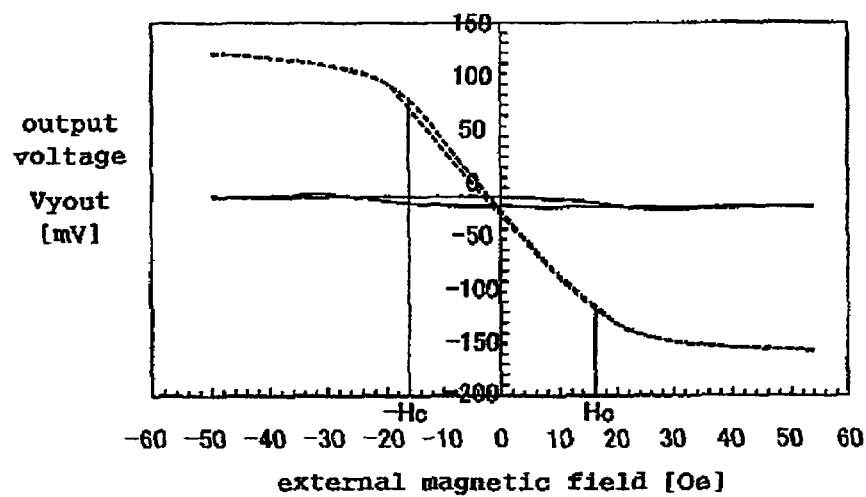
FIG. 49 is a graph depicting the change in the output voltage (solid line) of the Y-axis magnetic sensor included in the magnetic sensor shown in FIG. 42 relative to a magnetic field changing in the X-axis direction and the change in the output voltage (broken line) of the sensor relative to a magnetic field changing in the Y-axis direction.

The Y-axis magnetic sensor is constructed by full bridge connection of the first to fourth Y-axis GMR elements 71 to 74 in the same manner as the X-axis magnetic sensor. Further, the pad 77 and the pad 78 are connected respectively to the positive electrode and the negative electrode of a constant power source (not illustrated) so as to give a voltage Vyin+ (5 V in this example) and a voltage Vyin− (0 V in this example). Then, the voltage difference between the pad 75 and the pad 76 is taken out as a sensor output Vyout. As a result of this, the Y-axis magnetic sensor shows an output voltage Vyout that changes generally in proportion to an external magnetic field that changes along the Y-axis in the range from −Hc to +Hc, as shown by a broken line in FIG. 49, and shows a generally "0" output voltage to an external magnetic field that changes along the X-axis, as shown by a solid line in FIG. 49.

Next, a method of producing the magnetic sensor 60 constructed in the aforesaid manner will be described. First, a plurality of films M, which are made of the aforesaid spin valve film SV and the aforesaid bias magnet film 61b, and which will constitute individual GMR elements, are formed in a manner like islands on a rectangular quartz glass 60a1, as illustrated by the plan view of FIG. 50. The films M are formed by successive lamination to precise thicknesses using a ultra high vacuum apparatus. These films M are formed so that the films M will be located at the positions of the GMR elements 61 to 64, 71 to 74 shown in FIG. 42 when the quartz glass .alpha.a1 is cut along the broken line of FIG. 50 by a cutting process carried out later and separated into individual chips 60a shown in FIG. 42. Further, alignment (positioning) marks 60b having a rectangular shape excluding a shape of a cross are formed at the four corners of the quarts glass 60a1.

Figure 51:
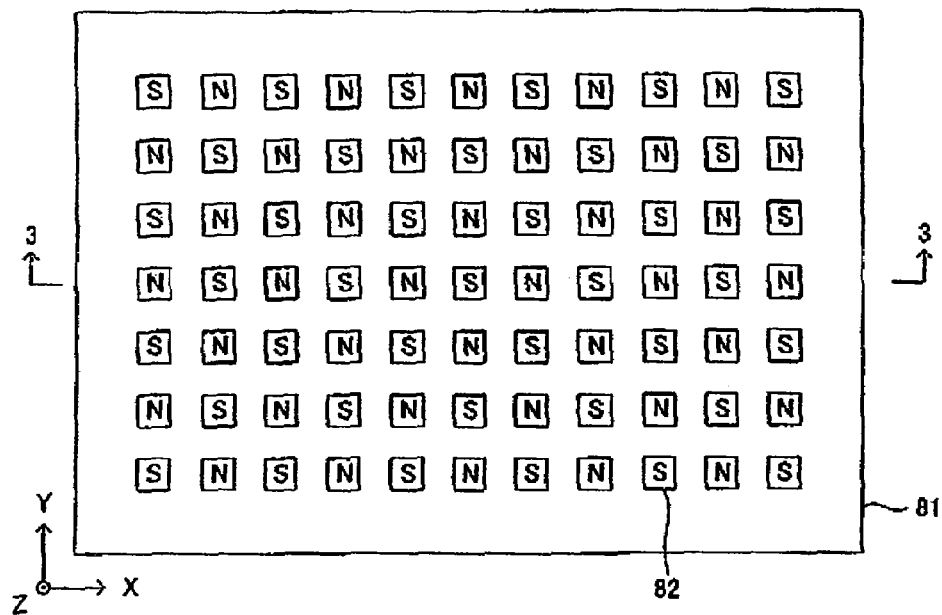
FIG. 51 is a plan view of a metal plate for preparing a magnet array to be used in the production of the magnetic sensor shown in FIG. 42.
Figure 52:
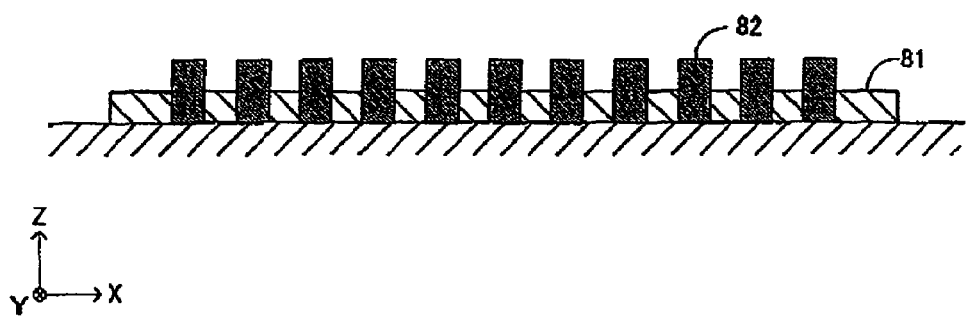
FIG. 52 is a cross-sectional view of the metal plate and the permanent bar magnets shown in FIG. 51 and cut with a plane along the line 3-3 of FIG. 51.

Next, as shown in FIG. 51 which is a plan view and in FIG. 52 which is a cross-sectional view cut with the cross section along the line 3-3 of FIG. 51, a rectangular metal plate 81 is prepared in which a plurality of square through-holes are formed in a square lattice configuration (namely, square through-holes having sides parallel to the X-axis and the Y-axis are formed to be equally spaced apart from each other along the X-axis and the Y-axis). Then, permanent bar magnets 82 . . . 82 having a rectangular parallelopiped shape and having approximately the same square cross section as the through-holes are inserted into the through-holes of the metal plate 81 so that the end surfaces of the permanent bar magnets 82 . . . 82, where the magnetic poles are formed, will be parallel to the metal plate 81. At this time, the permanent bar magnets 82 . . . 82 are arranged so that the polarity of the magnetic pole of each permanent bar magnet 82 will be different from the polarity of the magnetic pole of the other permanent bar magnets 82 adjacent thereto and space apart therefrom by the shortest distance. Here, the permanent bar magnets 82 . . . 82 to be used have a magnetic charge of the same magnitude.

Figure 53:
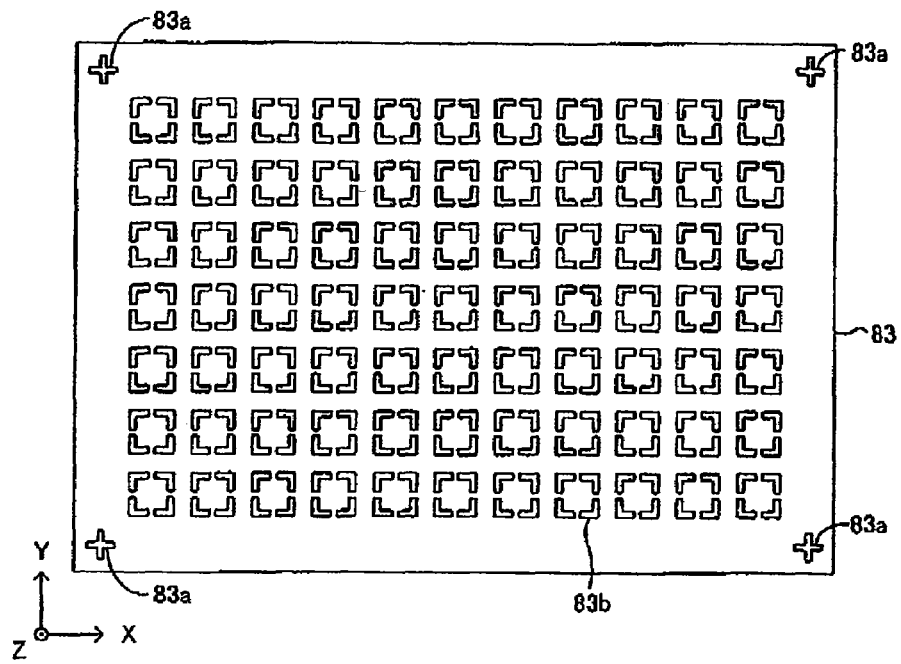
FIG. 53 is a plan view of a plate for forming a magnet array to be used in the production of the magnetic sensor shown in FIG. 42.
Figure 54:
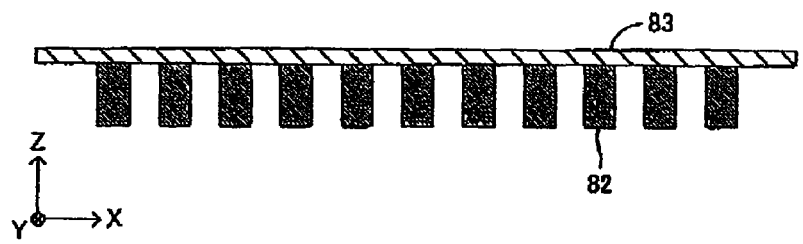
FIG. 54 is a cross-sectional view of the magnet array to be used in the production of the magnetic sensor shown in FIG. 42.

Next, as shown in a plan view of FIG. 53, a plate 83 is prepared which has a thickness of about 0.5 mm and which is made of transparent quartz glass having approximately the same rectangular shape as the aforesaid metal plate 81. This plate 83 is let to have alignment (positioning) marks 83a having a shape of a cross on the four corners for positioning in cooperation with the alignment marks 60b of the aforesaid quarts glass 60a1. Further, in the central part, alignment marks 83b are formed at positions corresponding to the outer shape of the permanent bar magnets 82 . . . 82 that are inserted into the aforesaid metal plate 81. Subsequently, as illustrated in FIG. 54, the upper-surface of the permanent bar magnets 82 . . . 82 are bonded to the lower surface of the plate 83 by means of an adhesive. At this time, the relative position of the permanent bar magnets 82 . . . 82 to the plate 83 is determined by using the alignment marks 83b. Then, the metal plate 81 is removed from the lower side. At this stage, the permanent bar magnets 82 . . . 82 and the plate 83 form a magnet array constructed in such a manner that a plurality of permanent magnets having square end surfaces constituting the magnetic poles are disposed at lattice points of a square lattice and the polarity of the magnetic pole of each permanent magnet is different from the polarity of the magnetic pole of the other permanent magnets adjacent thereto and spaced apart therefrom by the shortest distance.

Figure 55:
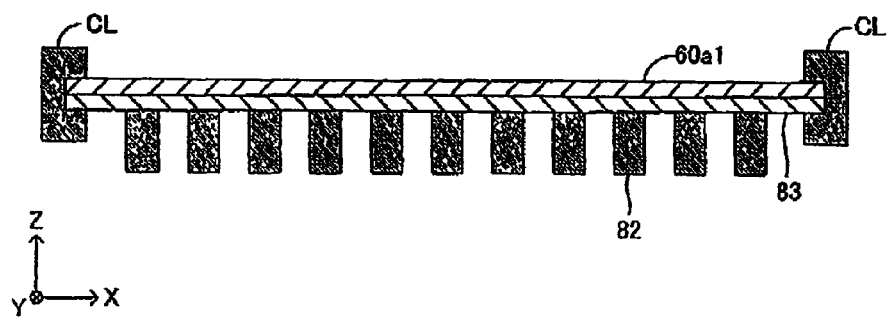
FIG. 55 is a cross-sectional view showing a step in the production of the magnetic sensor shown in FIG. 42.

Next, as illustrated in FIG. 55, the quartz glass 60a1, on which the films to become the GMR elements (the layer containing the magnetic layer to become the pinned layer, that is, the layer containing the magnetic layer to become the fixed magnetization layer) are formed, is positioned so that the surface on which the films to become the GMR elements are formed will be brought into contact with the upper surface of the plate 83. The relative position of the quartz glass 60a1 to the plate 83 is exactly determined by bringing the cross shape of the alignment marks 83a into respective coincidence with the part of the aforesaid alignment marks 60b where the cross shape has been removed.

Figure 56:
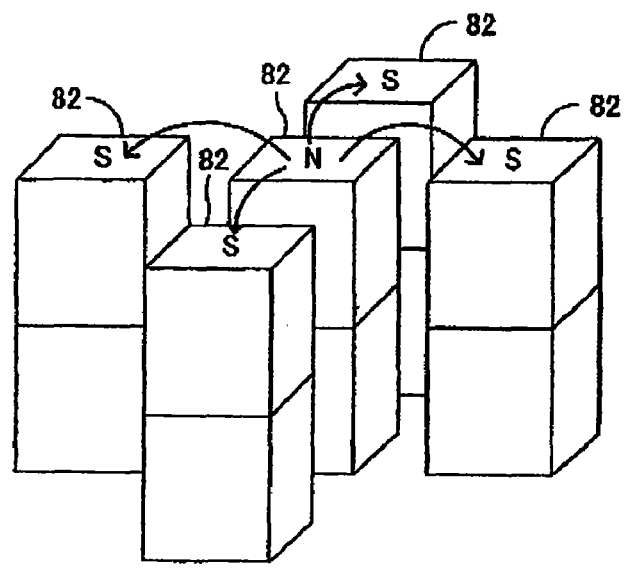
FIG. 56 is a perspective view illustrating some magnets taken out from the magnet array shown in FIG. 54.
Figure 57:
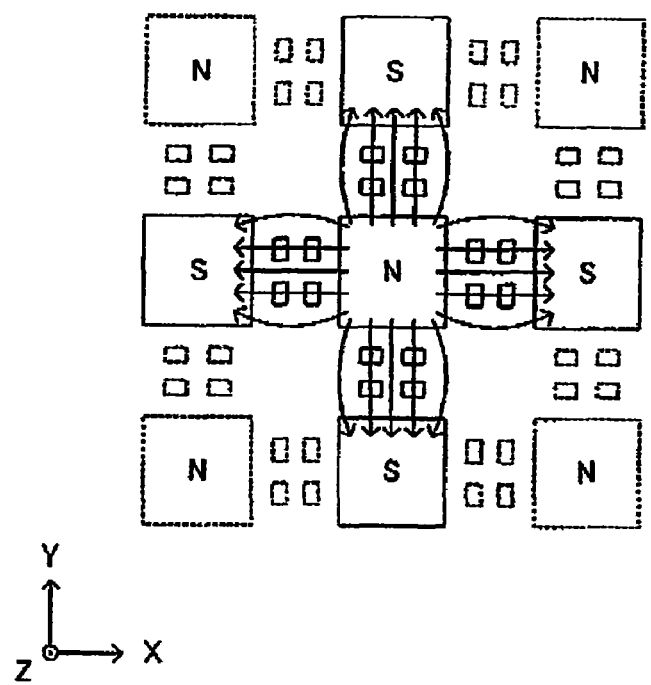
FIG. 57 is a conceptual view illustrating a method for pinning the magnetization direction of the pinned layer of each GMR element of the magnetic sensor shown in FIG. 42.

FIG. 56 is a perspective view illustrating a state in which four of the aforesaid permanent bar magnets 82 . . . 82 have been taken out. As will be clear from this figure, above the upper surface of the permanent bar magnets 82 . . . 82, magnetic fields are formed from one N-pole towards the four S-poles adjacent to the N-pole by the shortest distance, i.e. in four directions that are different from each other by 90.degree. Therefore, as illustrated by a model view of FIG. 57, in the state in which the quartz glass 60a1 is placed on the upper surface of the plate 83 shown in FIG. 55, magnetic fields in the positive direction of the Y-axis, in the positive direction of the X-axis, in the negative direction of the Y-axis, and in the negative direction of the X-axis are applied to the films which are placed in parallel to each side of the square end surface of one N-pole and which will become the GMR elements.

In this embodiment, by using such magnetic fields, a thermal treatment is carried out to fix the magnetization direction of the fixed magnetization layer P (the pinned layer of the fixed magnetization layer P). Namely, in the state shown in FIG. 55. the plate 83 and the quartz glass 60a1 are fixed to each other by a clamp CL, heated to 250.degree. C. to 280.degree. C. in vacuum, and left to stand in this state for about four hours.

Figure 50:
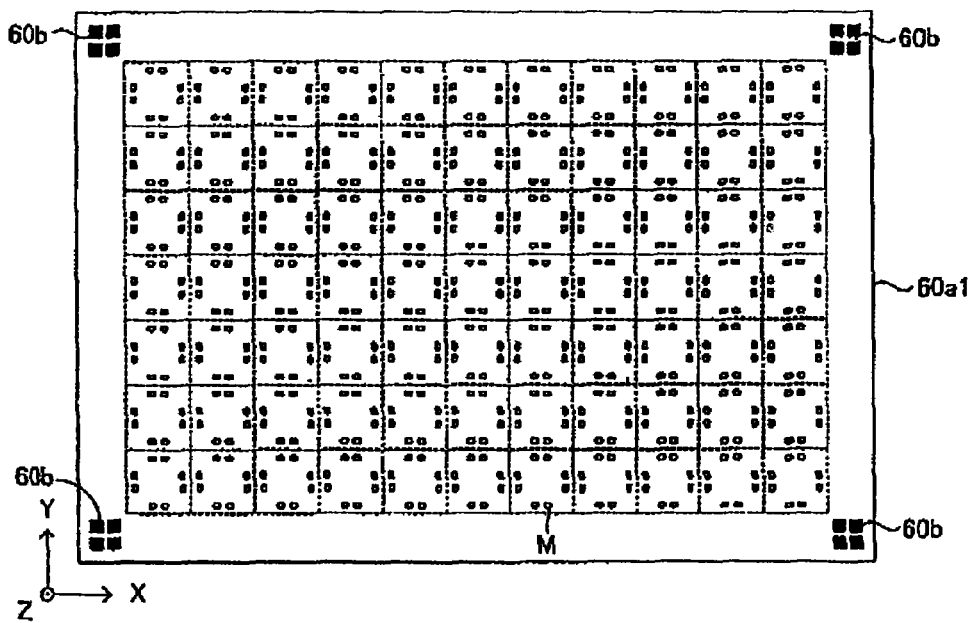
FIG. 50 is a plan view of quartz glass on which a spin valve film has been formed at one stage during the production of the magnetic sensor shown in FIG. 42.

Thereafter, the quartz glass 60a1 is taken out; the pads 65 to 68. 75 to 78 shown in FIG. 42 are formed; a wiring connecting these is formed; and finally the quartz glass 60a1 is cut along the broken lines shown in FIG. 50. The above process completes the production of the magnetic sensor 60 shown in FIG. 42.

Figure 58:
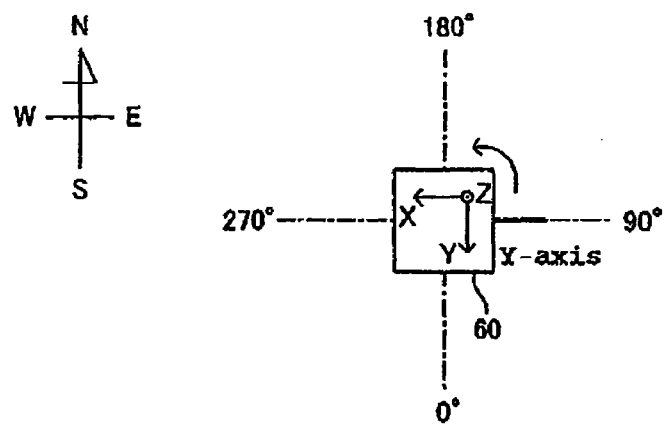
FIG. 58 is a view illustrating a relationship between the magnetic sensor shown in FIG. 42 and the azimuth.
Figure 59:
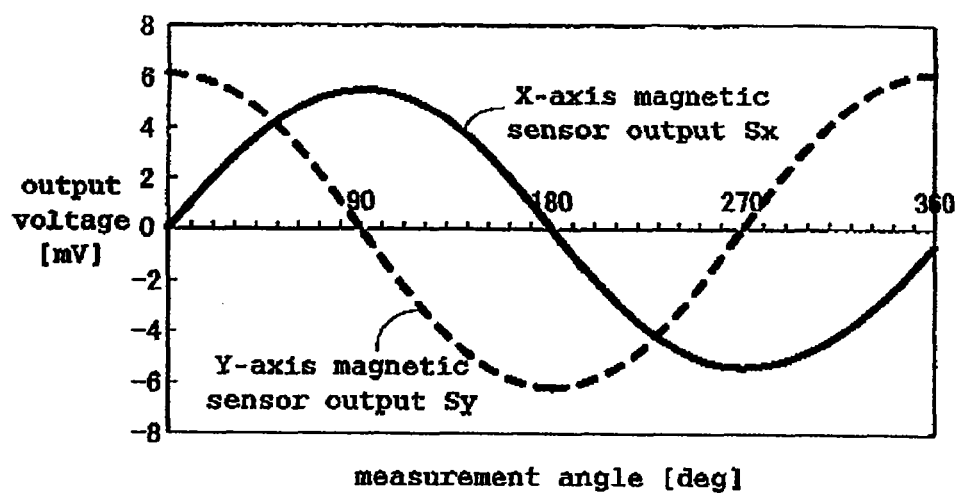
FIG. 59 is a graph depicting an output voltage of the magnetic sensor shown in FIG. 42 relative to the azimuth.

Next, the result of measurement of geomagnetism using the aforesaid magnetic sensor 60 will be described. In this measurement, the azimuth theta. (measurement angle) is defined as 0.degree. when the positive direction of the Y-axis of the magnetic sensor 60 is directed to the south, as illustrated in FIG. 58. The measurement results are shown in FIG. 59. As will be clear from FIG. 59. the X-axis magnetic sensor output Sx shown by a solid line changes like a sine curve, and the Y-axis magnetic sensor output Sy shown by a broken line changes like a cosine curve. This result is exactly as expected from the characteristics shown in FIGS. 48 and 49.

In this case, the azimuth can be determined by (1) .theta.=arctan(Sx/Sy) when the X-axis magnetic sensor output Sx and the Y-axis magnetic sensor output Sy both assume positive values; (2) .theta.=180.degree.+arctan(Sx/Sy) when the Y-axis magnetic sensor output Sy assumes a negative value: and (3) .theta.=360.degree.+arctan(Sx/Sy) when the X-axis magnetic sensor output Sx assumes a negative value and the Y-axis magnetic sensor output Sy assumes a positive value. Therefore, the magnetic sensor 60 can be used, for example, as a geomagnetism (azimuth) sensor that can be mounted onto portable type electronic devices such as a portable telephone. Here, if the representation in the range from −90.degree. to 0.degree. is permitted when the azimuth is within the range from 270.degree. to 360.degree., the azimuth may be determined by .theta.=arctan(Sx/Sy) when the output Sy is positive, and by .theta.=180.degree.+arctan(Sx/Sy) when the output Sy is negative.

As described above, according to the third embodiment, a magnet array is prepared which is constructed in such a manner that a plurality of permanent magnets are disposed at lattice points of a square lattice and the polarity of the magnetic pole of each permanent magnet is different from the polarity of the magnetic pole of the other permanent magnets adjacent thereto and spaced apart therefrom by the shortest distance, and the magnetization direction of the magnetic layer that will become the aforesaid pinned layer is pinned with the use of the magnetic fields formed by the magnet array. Therefore, on a single chip, one can easily form GMR elements in which the pinned magnetization directions of the pinned layers are different from each other (perpendicular to each other). Further, by this method, one can produce single chips each having GMR elements in which the pinned magnetization directions of the pinned layers are different from each other, at a time and in a large amount, thereby leading to reduction in the cost of producing the single chips.

Here, the present invention is by no means limited to the aforesaid embodiments, and various modifications may be made within the scope of the present invention. For example, though NiCo having a large residual magnetization is adopted as a plating film in the aforesaid first and second embodiments, other materials (for example, Co) having a large residual magnetization may be adopted in place of NiCo. Further, the method of fixing the magnetization direction of the fixed magnetization layer in the first and second embodiments can be applied to other magnetoresistance effect elements having pinned layers (layers having a fixed magnetization axis) such as in the third embodiment. Furthermore, though PtMn is used as a pinning layer of the fixed magnetization layer P in the aforesaid three embodiments, FeMn, IrMn, or the like may be used in place of this PtMn.

What is claimed is:

1. A magnetic sensor which detects a magnetic field comprising:

eight magnetoresistance effect elements including a first through an eighth element, each of said elements comprising a spin valve film, the film comprising a free layer, a spacer layer and a pinned layer, said pinned layer having a pinned magnetization direction, wherein said layers are successively laminated on a substrate of a single chip, the substrate having a generally square shape which has a left side along a Y-axis, a right side along the Y-axis, a top side along an X-axis and a bottom side along the X-axis in a plan view, the X-axis and the Y-axis are perpendicular to each other, and each of the elements has a resistance value that changes in accordance with a relative angle formed by a magnetization direction of said pinned layer and a magnetization direction of said free layer;

said magnetic sensor being formed in such a manner that said magnetoresistance effect elements are provided on a single plane, (a) said first element being formed at a position closer to the left side than the right side and below a first center line of the right side and the left side, the first center line being perpendicular to the Y-axis, and said first element, having a pinned magnetization direction of said first element's pinned layer in a direction of the X-axis;

(b) said second element being formed at a position closer to the left side than the right side and above the first center line, and said second element having a pinned magnetization direction of said second element's pinned layer in the direction of the X-axis;

(c) said third element being formed at a position closer to the right side than the left side other sides and above the first center line, and said third element having a pinned magnetization direction of said third element's pinned layer in the direction of the X-axis;

(d) said fourth element being formed at a position closer to the right side than the left side and below the first center line, and said fourth element having a pinned magnetization direction of said fourth element's pinned layer in the direction of the X-axis;

(e) said fifth element being formed at a position closer to the top side than the bottom side and left of a second center line of the top and bottom sides, the second center line being perpendicular to the X-axis, and said fifth element having a pinned magnetization direction of said fifth element's pinned layer in the direction of the Y-axis;

(f) said sixth element being formed at a position closer to the top side than the bottom side and right of the second center line, and said sixth element having a pinned magnetization direction of said sixth element's pinned layer in the direction of the Y-axis;

(g) said seventh element being formed at a position closer to the bottom side than the top side and right of the second center line, and said seventh element having a pinned magnetization direction of said seventh element's pinned layer in the direction of the Y-axis;

(h) said eighth element being formed at a position closer to the bottom side than the top side and left of the second center line, and said eighth element having a pinned magnetization direction of said eighth element's pinned layer in the direction of the Y-axis;

(i) said first to fourth elements construct an X-axis magnetic sensor for detecting a magnetic field in the direction of the X-axis by full bridge connection using a first wiring connecting the first to fourth elements; and (j) said fifth to eighth elements construct a Y-axis magnetic sensor for detecting a magnetic field in the direction of the Y-axis by full bridge connection using a second wiring connecting the fifth to eighth elements, (k) wherein said first wiring and said second wiring are provided on the single plane and are formed in such a manner that the said second wiring is surrounded by said first wiring.

2. A magnetic sensor which detects a magnetic field comprising:

eight magnetoresistance effect elements including a first through an eighth element, each of said elements comprising a spin valve film, the film comprising a free layer, a spacer layer and a pinned layer, said pinned layer having a pinned magnetization direction, wherein said layers are successively laminated on a substrate of a single chip, the substrate having a generally square shape which has a left side along a Y-axis, a right side along the Y-axis, a top side along an X-axis and a bottom side along the X-axis in a plan view, the X-axis and the Y-axis are perpendicular to each other, and each of the elements has a resistance value that changes in accordance with a relative angle formed by a magnetization direction of said pinned layer and a magnetization direction of said free layer;

said magnetic sensor being formed in such a manner that said magnetoresistance effect elements are provided on a single plane, (a) said first element being formed at a position closer to the left side than the right side and below a first center line of the left and right sides, the first center line being perpendicular to the Y-axis, and said first element, having a pinned magnetization direction of said first element's pinned layer in a direction of the X-axis;

(b) said second element being formed at a position closer to the left side than the right side and above the first center line, and said second element having a pinned magnetization direction of said second element's pinned layer in the direction of the X-axis;

(c) said third element being formed at a position closer to the right side than the left side and above the first center line, and said third element having a pinned magnetization direction of said third element's pinned layer in the direction of the X-axis;

(d) said fourth element being formed at a position closer to the right side than the left side and below the first center line, and said fourth element having a pinned magnetization direction of said fourth element's pinned layer in the direction of the X-axis;

(e) said fifth element being formed at a position closer to the top side than the bottom side and left of a second center line of the top and bottom sides, the second center line being perpendicular to the X-axis, and said fifth element having a pinned magnetization direction of said fifth element's pinned layer in the direction of the Y-axis;

(f) said sixth element being formed at a position closer to the top side than the bottom side and right of the second center line, and said sixth element having a pinned magnetization direction of said sixth element's pinned layer in the direction of the Y-axis;

(g) said seventh element being formed at a position closer to the bottom side than the top side and right of the second center line, and said seventh element having a pinned magnetization direction of said seventh element's pinned layer in the direction of the Y-axis;

(h) said eighth element being formed at a position closer to the bottom side than the top side and left of the second center line, and said eighth element having a pinned magnetization direction of said eighth element's pinned layer in the direction of the Y-axis;

(i) said first to fourth elements construct an X-axis magnetic sensor for detecting a magnetic field in the direction of the X-axis by full bridge connection using a first wiring connecting the first to fourth elements;

(j) said fifth to eighth elements construct a Y-axis magnetic sensor for detecting a magnetic field in the direction of the Y-axis by full bridge connection using a second wiring connecting the fifth to eighth elements;

(k) the pinned magnetization direction of the pinned layer of the first and the second elements are in a negative direction of the X-axis;

(l) the pinned magnetization direction of the pinned layer of the third and the fourth elements are in a positive direction of the X-axis;

(m) the pinned magnetization direction of the pinned layer of the fifth and the sixth elements are in a positive direction of the Y-axis; and (n) the pinned magnetization direction of the pinned layer of the seventh and the eighth elements are in a negative direction of the Y-axis, (o) wherein said first wiring and said second wiring are provided on the single plane and are formed in such a manner that the said second wiring is surrounded by said first wiring.

3. A magnetic sensor which detects a magnetic field comprising a plurality of magnetoresistance effect elements, each element comprising a spin valve film, the film comprising a free layer, a spacer layer and a pinned layer having a pinned magnetization direction, each element having a resistance value that changes in accordance with a relative angle formed by a magnetization direction of the pinned layer and a magnetization direction of the free layer, wherein, (a) said layers of each of the magnetoresistance effect elements are successively laminated directly on a single substrate of a single chip;

(b) an X-axis group of four of a plurality of said magnetoresistance effect elements constructs an X-axis magnetic sensor for detecting a magnetic field in an X-axis direction and all of said magnetoresistance effect elements of the X-axis group have pinned magnetization directions of the pinned layers parallel to each other, (c) a Y-axis group of four of a plurality said magnetoresistance effect elements constructs a Y-axis magnetic sensor for detecting a magnetic field in a Y-axis direction perpendicular to the X-axis direction and all of said magnetoresistance effect elements of the Y-axis group have pinned magnetization directions of the pinned layers parallel to each other;

(d) said X-axis group of magnetoresistance effect elements construct the X-axis magnetic sensor by full bridge connection using a first wiring connecting the magnetoresistance effect elements belonging to the X-axis group, and the pinned magnetization directions of the X-axis group of magnetoresistance effect elements are in the X-axis direction; and (e) said Y-axis group of magnetoresistance effect elements construct the Y-axis magnetic sensor by full bridge connection using a second wiring connecting the magnetoresistance effect elements belonging to the Y-axis group, and the pinned magnetization directions of the Y-axis group of magnetoresistance effect elements are in the Y-axis direction, (f) wherein said fire wiring and said second wiring are provided on a single plane and are formed in such a manner that the said second wiring is surrounded by said first wiring.

* * * * *